United States Patent
Sanchez Bermudez et al.

(10) Patent No.: US 11,514,214 B2
(45) Date of Patent: Nov. 29, 2022

(54) FORMING A DATASET FOR INFERENCE OF SOLID CAD FEATURES

(71) Applicant: DASSAULT SYSTEMES, Velizy-Villacoublay (FR)

(72) Inventors: Fernando Manuel Sanchez Bermudez, Velizy-Villacoublay (FR); Eloi Mehr, Velizy-Villacoublay (FR)

(73) Assignee: DASSAULT SYSTEMES, Velizy-Villacoublay (FR)

( * ) Notice: Subject to any disclaimer, the term of this patent is extended or adjusted under 35 U.S.C. 154(b) by 143 days.

(21) Appl. No.: 16/727,338

(22) Filed: Dec. 26, 2019

(65) Prior Publication Data

US 2020/0210636 A1 Jul. 2, 2020

(30) Foreign Application Priority Data

Dec. 29, 2018 (EP) ..................................... 18306887

(51) Int. Cl.
*G06F 30/27* (2020.01)
*G06F 30/10* (2020.01)

(52) U.S. Cl.
CPC .............. *G06F 30/27* (2020.01); *G06F 30/10* (2020.01)

(58) Field of Classification Search
CPC .......... G06F 30/27; G06F 30/10; G06F 30/13; G06F 30/00; G06F 30/12; G06F 30/15; G06F 30/17; G06F 2111/00; G06F 30/19; G06T 19/20; G06T 17/00; G06T 11/203; G06T 17/10; G06T 2219/2021; G06T 2210/04
See application file for complete search history.

(56) References Cited

U.S. PATENT DOCUMENTS 4,951,227 A * 8/1990 Todd ..................... G06T 11/203
345/441
5,537,519 A * 7/1996 Vossler .................. G06T 17/10
345/423

(Continued)

OTHER PUBLICATIONS

Qian Yu, et al.; "Sketch-a-Net: A Deep Neural Network that Beat Humans"; International Journal of Computer Vision, Kluwer Academic Publishers, Norwell, US; vol. 122, No. 3; XP036214041; Jul. 26, 2016; 15 pgs.

(Continued)

*Primary Examiner* — Charles L Beard
(74) *Attorney, Agent, or Firm* — Oblon, McClelland, Maier & Neustadt, L.L.P.

(57) ABSTRACT

A computer-implemented method for forming a dataset configured for learning a neural network. The neural network is configured for inference, from a freehand drawing representing a 3D shape, of a solid CAD feature representing the 3D shape. The method includes generating one or more solid CAD feature includes each representing a respective 3D shape. The method also includes, for each solid CAD feature, determining one or more respective freehand drawings each representing the respective 3D shape, and inserting in the dataset, one or more training samples. Each training sample includes the solid CAD feature and a respective freehand drawing. The method forms an improved solution for inference, from a freehand drawing representing a 3D shape, of a 3D modeled object representing the 3D shape.

20 Claims, 6 Drawing Sheets

(56) References Cited

U.S. PATENT DOCUMENTS

| | | | | |
|---|---|---|---|---|
| 5,945,995 A * | 8/1999 | Higuchi | G06T 17/10 | 345/420 |
| 6,628,279 B1 * | 9/2003 | Schell | G06F 3/04845 | 345/420 |
| 6,629,065 B1 * | 9/2003 | Gadh | G06T 19/20 | 703/1 |
| 6,912,293 B1 * | 6/2005 | Korobkin | G06T 15/20 | 382/284 |
| 8,230,358 B1 * | 7/2012 | Chaudhri | G06F 3/0486 | 715/767 |
| 8,334,869 B1 * | 12/2012 | Padmakar | G06T 17/10 | 345/420 |
| 9,886,528 B2 * | 2/2018 | Rameau | G06T 17/00 | |
| 9,886,530 B2 * | 2/2018 | Mehr | G06T 7/75 | |
| 9,898,860 B2 * | 2/2018 | Liu | G06T 11/206 | |
| 9,972,127 B1 * | 5/2018 | Gibson | G06F 3/04842 | |
| 10,013,801 B2 * | 7/2018 | Mehr | G06F 30/00 | |
| 10,168,899 B1 * | 1/2019 | Feiszli | G06F 3/04883 | |
| 10,248,664 B1 * | 4/2019 | Shen | G06N 3/0454 | |
| 10,719,549 B2 * | 7/2020 | Lieutier | G06F 30/00 | |
| 10,730,181 B1 * | 8/2020 | Rajkumar | B25J 9/1653 | |
| 10,740,500 B1 * | 8/2020 | Winn | G06F 30/00 | |
| 10,755,005 B1 * | 8/2020 | Jost | G06F 30/20 | |
| 10,832,095 B2 * | 11/2020 | Panciatici | G06K 9/6267 | |
| 10,873,456 B1 * | 12/2020 | Dods | G06N 20/00 | |
| 10,929,433 B2 * | 2/2021 | Rorato | G06V 20/653 | |
| 11,080,910 B2 * | 8/2021 | Kang | G06F 40/169 | |
| 11,197,744 B1 * | 12/2021 | Raslambekov | G16H 50/50 | |
| 11,221,750 B2 * | 1/2022 | Krishnamurthy | G06F 3/0346 | |
| 2003/0071810 A1 * | 4/2003 | Shoov | G06F 30/00 | 345/420 |
| 2004/0090439 A1 * | 5/2004 | Dillner | G06V 30/422 | 717/100 |
| 2004/0249809 A1 * | 12/2004 | Ramani | G06F 16/248 | |
| 2006/0227130 A1 * | 10/2006 | Elchuri | G06T 19/20 | 345/419 |
| 2006/0250393 A1 * | 11/2006 | Tsang | G06T 11/203 | 345/420 |
| 2008/0225007 A1 * | 9/2008 | Nakadaira | G06F 3/03545 | 345/173 |
| 2008/0297503 A1 * | 12/2008 | Dickinson | G06T 17/10 | 345/420 |
| 2009/0049081 A1 * | 2/2009 | Loberg | G06F 16/289 | |
| 2010/0268513 A1 * | 10/2010 | Loberg | G06F 30/13 | 703/1 |
| 2012/0089374 A1 * | 4/2012 | Kripac | G06T 17/30 | 703/1 |
| 2012/0141032 A1 * | 6/2012 | Ouyang | G06V 30/422 | 382/187 |
| 2012/0256960 A1 * | 10/2012 | Chaudhri | G06F 3/0486 | 345/650 |
| 2013/0181986 A1 * | 7/2013 | Fowler | G06T 17/30 | 345/420 |
| 2014/0067106 A1 * | 3/2014 | Makeig | B29C 64/386 | 700/98 |
| 2014/0074272 A1 * | 3/2014 | Cowden, IV | B33Y 50/00 | 700/97 |
| 2014/0229143 A1 * | 8/2014 | Cohen-Or | G06T 17/10 | 703/1 |
| 2014/0334737 A1 * | 11/2014 | Shao | G06T 17/10 | 382/197 |
| 2015/0271218 A1 * | 9/2015 | Steingrimsson | G06Q 10/101 | 709/204 |
| 2016/0162603 A1 * | 6/2016 | Schriesheim | G06F 30/00 | 703/1 |
| 2016/0217610 A1 * | 7/2016 | Liu | G06T 11/206 | |
| 2016/0246899 A1 * | 8/2016 | Hirschtick | G06F 30/17 | |
| 2016/0335758 A1 * | 11/2016 | Shao | G06V 10/42 | |
| 2017/0148227 A1 * | 5/2017 | Alsaffar | G06T 11/60 | |
| 2017/0193699 A1 * | 7/2017 | Mehr | G06F 5/00 | |
| 2017/0213132 A1 * | 7/2017 | Hammond | G06F 9/4881 | |
| 2018/0085203 A1 * | 3/2018 | Ramirez | G06F 30/00 | |
| 2018/0122138 A1 * | 5/2018 | Piya | G06T 17/10 | |
| 2018/0122379 A1 * | 5/2018 | Sohn | G10L 15/18 | |
| 2018/0158239 A1 * | 6/2018 | Piya | G06T 17/20 | |
| 2018/0173815 A1 * | 6/2018 | Stiles | G06F 30/17 | |
| 2018/0198730 A1 * | 7/2018 | Cook | H04L 65/60 | |
| 2018/0204376 A1 * | 7/2018 | Winnemöller | G06T 19/20 | |
| 2018/0349724 A1 * | 12/2018 | Xiang | G06K 9/6288 | |
| 2018/0365344 A1 * | 12/2018 | Jarvinen | G06T 19/00 | |
| 2019/0005185 A1 * | 1/2019 | D'Antuono | G06F 30/15 | |
| 2019/0034484 A1 * | 1/2019 | Das | G06N 5/022 | |
| 2019/0065994 A1 * | 2/2019 | Wang | G06K 9/6292 | |
| 2019/0066374 A1 * | 2/2019 | Santos | G06T 17/10 | |
| 2019/0096116 A1 * | 3/2019 | Cheong | G06T 15/02 | |
| 2019/0147627 A1 * | 5/2019 | Chen | G06N 3/08 | 345/157 |
| 2019/0155986 A1 * | 5/2019 | Schmitter | G06F 30/13 | |
| 2019/0228115 A1 * | 7/2019 | Bergin | G06N 3/0472 | |
| 2019/0279424 A1 * | 9/2019 | Clausen | G06T 19/003 | |
| 2019/0303514 A1 * | 10/2019 | Winn | G06F 30/00 | |
| 2019/0333272 A1 * | 10/2019 | Tsuchie | G06T 17/30 | |
| 2019/0362029 A1 * | 11/2019 | Huang | G06T 17/30 | |
| 2019/0370617 A1 * | 12/2019 | Singh | G06N 3/088 | |
| 2019/0388123 A1 * | 12/2019 | Pavlovskaia | A61B 90/37 | |
| 2020/0050736 A1 * | 2/2020 | Shayani | G06F 30/27 | |
| 2020/0057824 A1 * | 2/2020 | Yeh | G06N 20/00 | |
| 2020/0089819 A1 * | 3/2020 | Gauderis | G06T 17/10 | |
| 2020/0118305 A1 * | 4/2020 | Yonetsuji | G06T 11/20 | |
| 2020/0151286 A1 * | 5/2020 | Willis | G06F 30/00 | |
| 2020/0151923 A1 * | 5/2020 | Bergin | G06T 17/10 | |
| 2020/0175757 A1 * | 6/2020 | Li | G06T 15/00 | |
| 2020/0202045 A1 * | 6/2020 | Mehr | G06F 30/27 | |
| 2020/0210845 A1 * | 7/2020 | Sanchez Bermudez | G06T 17/10 | |
| 2020/0320891 A1 * | 10/2020 | Chehadeh | G09B 5/02 | |
| 2020/0388071 A1 * | 12/2020 | Grabner | G06T 17/00 | |
| 2021/0004510 A1 * | 1/2021 | Marini | G06T 17/10 | |
| 2021/0064001 A1 * | 3/2021 | de Beus | G06N 3/08 | |
| 2021/0064858 A1 * | 3/2021 | Batra | G06N 3/0472 | |
| 2021/0090337 A1 * | 3/2021 | Ravasz | G06T 19/006 | |
| 2021/0117648 A1 * | 4/2021 | Yang | G06K 9/6215 | |
| 2021/0124670 A1 * | 4/2021 | Watanabe | G06F 30/17 | |
| 2021/0157961 A1 * | 5/2021 | Randon | G06F 30/23 | |
| 2021/0165561 A1 * | 6/2021 | Wei | G06T 17/00 | |
| 2021/0165923 A1 * | 6/2021 | Johnston | G02B 27/017 | |
| 2021/0182674 A1 * | 6/2021 | Petit | G06F 8/60 | |
| 2021/0187791 A1 * | 6/2021 | Bickel | G06F 30/00 | |
| 2021/0192098 A1 * | 6/2021 | Baardse | G06F 30/00 | |
| 2021/0224695 A1 * | 7/2021 | Stefanov | G06V 30/40 | |
| 2021/0232224 A1 * | 7/2021 | Cipoletta | G06F 3/014 | |
| 2021/0232225 A1 * | 7/2021 | Cipoletta | G06F 3/014 | |
| 2021/0232226 A1 * | 7/2021 | Cipoletta | H04W 4/021 | |
| 2021/0232716 A1 * | 7/2021 | Gibbens | G06F 30/17 | |
| 2021/0232858 A1 * | 7/2021 | Mukherjee | G06V 20/653 | |
| 2021/0233330 A1 * | 7/2021 | Sutherland | G06F 3/011 | |
| 2021/0234975 A1 * | 7/2021 | Okuma | G09G 5/22 | |
| 2021/0240880 A1 * | 8/2021 | Zhou | G06F 3/00 | |
| 2021/0240881 A1 * | 8/2021 | Apte | G06F 30/17 | |
| 2021/0241503 A1 * | 8/2021 | Yonetsuji | G06T 7/90 | |
| 2021/0251664 A1 * | 8/2021 | Pavlovskaia | B33Y 50/00 | |
| 2021/0263963 A1 * | 8/2021 | Cho | G06F 16/583 | |
| 2021/0283944 A1 * | 9/2021 | Moghadampour | B43L 13/205 | |
| 2021/0312099 A1 * | 10/2021 | Apte | G06T 19/20 | |
| 2021/0333777 A1 * | 10/2021 | Abad | G05B 19/4099 | |
| 2021/0358164 A1 * | 11/2021 | Liu | G06T 7/73 | |
| 2022/0000592 A1 * | 1/2022 | Ramirez | A61C 5/77 | |
| 2022/0004674 A1 * | 1/2022 | Hanel | G06F 30/15 | |
| 2022/0004675 A1 * | 1/2022 | Thielhelm | G06F 30/20 | |
| 2022/0004682 A1 * | 1/2022 | Bandara | B29C 64/393 | |
| 2022/0012388 A1 * | 1/2022 | Wyrwas | G06F 11/3664 | |
| 2022/0019932 A1 * | 1/2022 | Wang | G06N 3/08 | |
| 2022/0027528 A1 * | 1/2022 | Makeig | G06F 30/12 | |
| 2022/0027671 A1 * | 1/2022 | Mukherjee | G06T 15/205 | |
| 2022/0058865 A1 * | 2/2022 | Beltrand | G06N 3/0472 | |
| 2022/0058866 A1 * | 2/2022 | Beltrand | G06N 3/0445 | |
| 2022/0179938 A1 * | 6/2022 | Zotto | G06F 21/36 | |

(56) References Cited

OTHER PUBLICATIONS

Gopal Sharma, et al.; "CSGNet: Neural Shape Parser for Constructive Solid Geometry"; arXiv:1712.08290v2; XP055595977; University of Massachusetts; Amherst, USA; Mar. 31, 2018; Retrieved From the Internet: URL: https://arxiv.org.pdf/1712.08290.pdf [retrieved Jun. 12, 2019]; 16 pgs.

Xin Chen, et al.; "AutoSweep: Recovering 3D Editable Objects from a Single Photograph"; IEEE Transactions on Visualization and Computer Graphics; vol. 14, No. 8, Aug. 2018; 10 pgs.

Johanna Delanoy, et al.; "3D Sketching Using Multi-View Deep Volumetric Prediction"; arxiv.org; Cornell University Library, 201 Olin Library Cornell University Ithaca, NY, 14853; XP081324881; Jul. 26, 2017; 11 pgs.

Tao Chen, et al.; "3-Sweep: Extracting Editable Objects from a Single Photo"; ACM Transactions on Graphics; vol. 32, No. 6; Article 195; Nov. 2013; 10 pgs.

Extended Search Report dated Oct. 10, 2019 in Europe Patent Application No. 18306887.3-1230; 11 pgs.

Extended Search Report dated Oct. 14, 2019 in Europe Patent Application No. 18306886.5-1230; 12 pgs.

Takeo Igarashi, et al.; "Teddy: A Sketching Interface for 3D Freeform Design"; Proceedings of the 26$^{th}$ Annual Conference on Computer Graphics and Interactive Techniques; 1999; 8 pgs.

Zhaoliang Lun, et al.; "3D Shape Reconstruction from Sketches via Multi-view Convolutional Networks"; 3D Vision (3DV), 2017 International Conference On, 2017; 11 pgs.

Baoxuan Xu, et al.; "True2Form: 3D Curve Networks from 2D Sketches via Selective Regularization"; ACM Transactions on Graphics, vol. 33, Issue 4; (SIGGRAPH 2014 Papers); 2014; Abstract Only; 4 pgs.

Changjian Li, et al.; BendSketch: Modeling Freeform Surfaces Through 2D Sketching; ACM Transactions on Graphics, vol. 36, No. 4, Article 125; Jul. 2017; 14 pgs.

Youyi Zheng, et al.; "Smart Canvas: Context-inferred Interpretation of Sketches for Preparatory Design Studies"; Computer Graphic Forum, 2016; Abstract Only; 2 pgs.

Yuwei Li et al.; "SweepCanvas: Sketch-based 3D Prototyping on an RGB-D Image"; Proceedings of the 30$^{th}$ Annual ACM Symposium on User Interface Software and Technology; 2017; 13 pgs.

Ronald J. Williams; "Simple Statistical Gradient-Following Algorithms for Connectionist Reinforcement Learning": Machine Learning; vol. 8, No. 3-4; 1992; 28 pgs.

\* cited by examiner

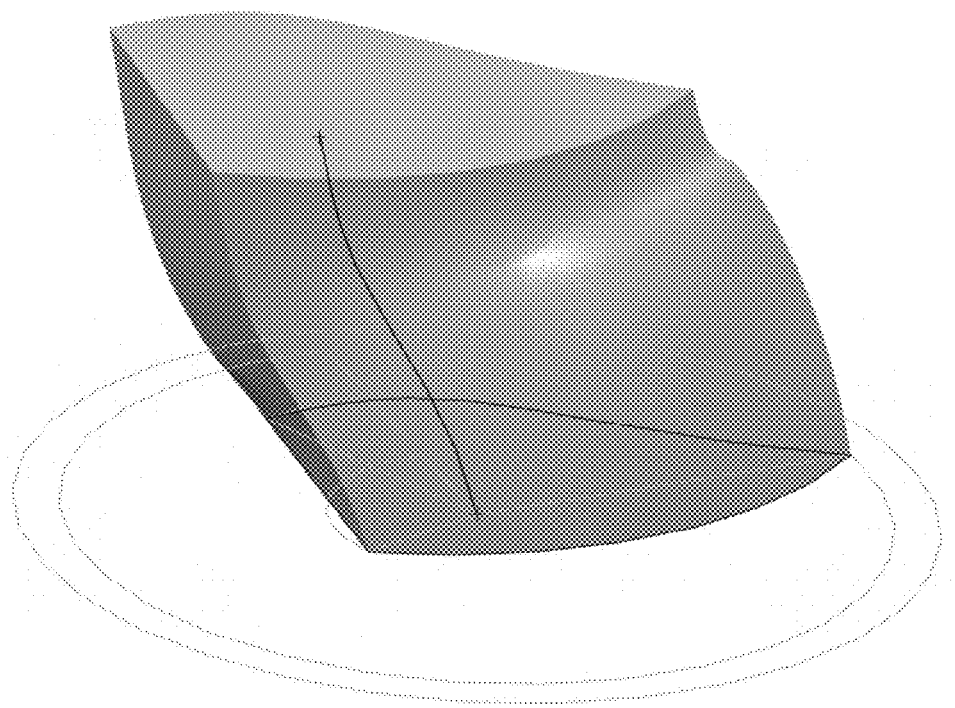
FIG. 5
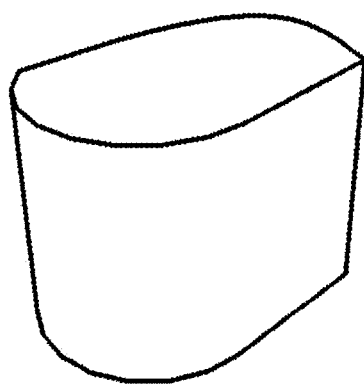 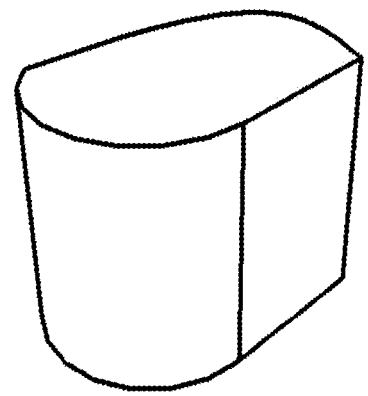
FIG. 6          FIG. 7

FORMING A DATASET FOR INFERENCE OF SOLID CAD FEATURES

CROSS-REFERENCE TO RELATED APPLICATIONS

This application claims priority under 35 U.S.C. § 119 or 365 to European Application No. 18306887.3, filed Dec. 29, 2018. The entire contents of the above application(s) are incorporated herein by reference.

FIELD OF THE DISCLOSURE

The disclosure relates to the field of computer programs and systems, and more specifically to solutions related to learning a neural network configured for inference, from a freehand drawing representing a 3D shape, of a 3D modeled object representing the 3D shape.

BACKGROUND

A number of systems and programs are offered on the market for the design, the engineering and the manufacturing of objects. CAD is an acronym for Computer-Aided Design, e.g. it relates to software solutions for designing an object.

CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by.

Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

In this context, researchers have been looking for solutions to infer a 3D modeled object representing a 3D shape from a freehand drawing representing the 3D shape. The following references notably relate to this issue:

[1] T. Igarashi, S. Matsuoka, and H. Tanaka, "Teddy: a sketching interface for 3D freeform design," in Proceedings of the 26th annual conference on Computer graphics and interactive techniques, 1999, pp. 409-416.

[2] Z. Lun, M. Gadelha, E. Kalogerakis, S. Maji, and R. Wang, "3D shape reconstruction from sketches via multi-view convolutional networks," in 3D Vision (3DV), 2017 International Conference on, 2017, pp. 67-77.

[3] J. Delanoy, M. Aubry, P. Isola, A. Efros, and A. Bousseau, "3D Sketching using Multi-View Deep Volumetric Prediction," Proceedings of the ACM on Computer Graphics and Interactive Techniques, vol. 1, no. 21, May 2018.

[4] B. Xu, W. Chang, A. Sheffer, A. Bousseau, J. McCrae, and K. Singh, "True2Form: 3D curve networks from 2D sketches via selective regularization," ACM Transactions on Graphics, vol. 33, no. 4, 2014.

[5] C. Li, H. Pan, Y. Liu, X. Tong, A. Sheffer, and W. Wang, "BendSketch: modeling freeform surfaces through 2D sketching," ACM Transactions on Graphics, vol. 36, no. 4, pp. 1-14, July 2017.

[6] Y. Zheng, H. Liu, J. Dorsey, and N. J. Mitra, "SmartCanvas: Context-inferred Interpretation of Sketches for Preparatory Design Studies," in Computer Graphics Forum, 2016, vol. 35, pp. 37-48.

[7] Y. Li, X. Luo, Y. Zheng, P. Xu, and H. Fu, "SweepCanvas: Sketch-based 3D Prototyping on an RGB-D Image," in Proceedings of the 30th Annual ACM Symposium on User Interface Software and Technology, 2017, pp. 387-399.

Papers [1] to [3] provide approaches to generate a 3D mesh from a sketch.

A main drawback of meshes is that they are hardly editable and provide no semantics. A 3D mesh discretizes a surface as a collection of basic polygons (often triangles). If the surface is watertight and manifold, it can represent a solid. Such a representation is not adapted for 3D modelling, as triangles should be edited one by one.

In addition, paper [1]'s approach generates round-like meshes. Furthermore, the approach of paper [1] requires sketch strokes to be annotated with an associated action (creation, extrusion, bending).

Paper [2] and paper [3] avoid this round-like shape priors as well as the necessity of annotated strokes thanks to recent advantages in deep learning.

However, both approaches still output a mesh. In addition, paper [2] requires one or several sketches of the object from a canonical point of view (i.e. front, side, top), which is a strong limitation for users.

Papers [4] to [7] provide approaches to generate parametric surfaces from sketches.

Paper [4] generates curves by enforcing some regularities on the sketch strokes (orthogonality, parallelism, coplanarity). Afterwards, surfaces may be fitted to the curves. This approach requires the user to be quite accurate during sketching: the strokes must represent the geometry of the object (following its surfaces but not necessarily its contours) and occluded strokes may be needed. Moreover, the user must specify the actual 3D intersection between strokes.

Paper [5] directly fits surfaces to the sketches. However, sketch strokes must be labelled. The labels provide some information about the surface that the sketch strokes should lie on: limit of the surface, concavity/convexity, sharp edge. Because of the nature of those labels, the user must be an expert in geometry, as a simple perspective sketch of the object will not be enough.

Thus, paper [4] and paper [5] provide solutions that fit a parametric surface to the input drawing, but the resulting surfaces are not necessarily closed, and as a consequence, they may not represent a solid. Even if they represent a solid, they cannot be edited as a meaningful solid CAD feature. Moreover, both methods require additional user inputs (intersections or stroke labelling).

Paper [6] generates 3D curves from sketch strokes. This approach makes the assumption that each stroke represents a planar 3D curve. Once the plane is identified, the 3D curve is obtained by back-projecting the stroke from the 2D sketch to the plane the stroke should lie on. Strokes lying on the same plane may intersect each other and define the boundaries of a planar surface patch. The obtained planar patches may be then extruded in the perpendicular direction. A main drawback of this approach is that plane orientations are limited to the three canonical orientations of the orthogonal reference frame. In order to define this reference frame, the user is required to explicit two sets of parallel lines, the first set of lines being orthogonal to the second one. Then, the reference frame is inferred form the vanishing points.

Paper [7] proposes a very similar approach. However, the proposed approach needs a depth image in addition to a classical RGB image. Stroke planes are directly estimated from the 3D of the scene provided by the depth map.

Thus, paper [6] and paper [7] provide techniques that produce results including a surface that may be extruded. However, both approaches suppose that the base 2D sketch lies on a restricted set of planes. In addition, both methods require additional inputs: pictures, user-definition of parallel lines, depth images.

Within this context, there is still a need for improved solutions for inference, from a freehand drawing representing a 3D shape, of a 3D modeled object representing the 3D shape.

SUMMARY

It is therefore provided a (dataset-forming) computer-implemented method for forming a dataset configured for learning a neural network. The neural network is configured for inference, from a freehand drawing representing a 3D shape, of a solid CAD feature representing the 3D shape. The method comprises generating one or more solid CAD feature includes each representing a respective 3D shape. The method also comprises, for each solid CAD feature, determining one or more respective freehand drawings each representing the respective 3D shape, and inserting in the dataset, one or more training samples. Each training sample includes the solid CAD feature and a respective freehand drawing.

The method may comprise one or more of the following:
- the determining of each freehand drawing comprises: providing a viewpoint from which the respective 3D shape is visible; and rendering in an image, relative to a solid representation of the respective 3D shape based on the solid CAD feature, one or more edges, each edge being a contour edge or a visible edge of the solid representation from the viewpoint;
- each visible edge is a $C^k$ discontinuity of the solid representation, k being an integer higher than or equal to 1;
- the determining of each freehand drawing further comprises perturbating at least part of the one or more rendered edges;
- the rendering of each edge is performed in a vectorial way, each edge being represented by one or more respective parametric curves, the perturbating comprising, for at least one respective parametric curve, adding a noise to one or more parameters of the at least one respective parametric curve;
- each solid CAD feature includes a respective sequence of curves, the generating comprising providing a set of curves and sampling the set of curves;
- the set of curves comprises a set product between: a discrete set of curve types, and for each curve type, a respective discrete set of one or more parameter domains each of a respective parameter, each parameter domain having respective parameter values of the respective parameter, the sampling comprising providing samples each including a respective curve type and a respective parameter value for each of the respective discrete set of one or more parameter domains;
- the discrete set of curve types comprises: a line type, an arc type, and/or a cubic Hermite interpolated segment type;
- each solid CAD feature includes a sweep operation, the generating comprising providing a set of sweep operations and sampling the set of sweep operations; and/or
- the set of sweep operations comprises a set product between: a discrete set of sweep curve types, and for each sweep curve type, a respective discrete set of one or more parameter domains each of a respective parameter, each parameter domain having respective parameters values of the respective parameter, the sampling comprising providing samples each including a respective sweep curve type and a respective parameter value for each of the respective discrete set of one or more parameter domains.

It is further provided a data structure representing a dataset formable according to the dataset-forming method.

It is further provided a computer-implemented (use) method of use of the dataset, the method comprising learning a neural network based on the dataset.

It is further provided a computer program comprising instructions for performing the dataset-forming method, and/or the use method.

It is further provided a device comprising a data storage medium having recorded thereon the data structure and/or the program. The device may form or serve as a non-transitory computer-readable medium, for example on a SaaS (Software as a service) or other server, or a cloud based platform, or the like. The device may alternatively comprise a processor coupled to the data storage medium. The device may thus form a computer system in whole or in part (e.g. the device is a subsystem of the overall system). The system may further comprise a graphical user interface coupled to the processor.

BRIEF DESCRIPTION OF THE DRAWINGS

Embodiments will now be described, by way of non-limiting example, and in reference to the accompanying drawings, where:

FIGS. 3, 4, 5, 6, 7, 8, 9, 10, 11 and 12 illustrate the methods.

DETAILED DESCRIPTION

Figure 1:
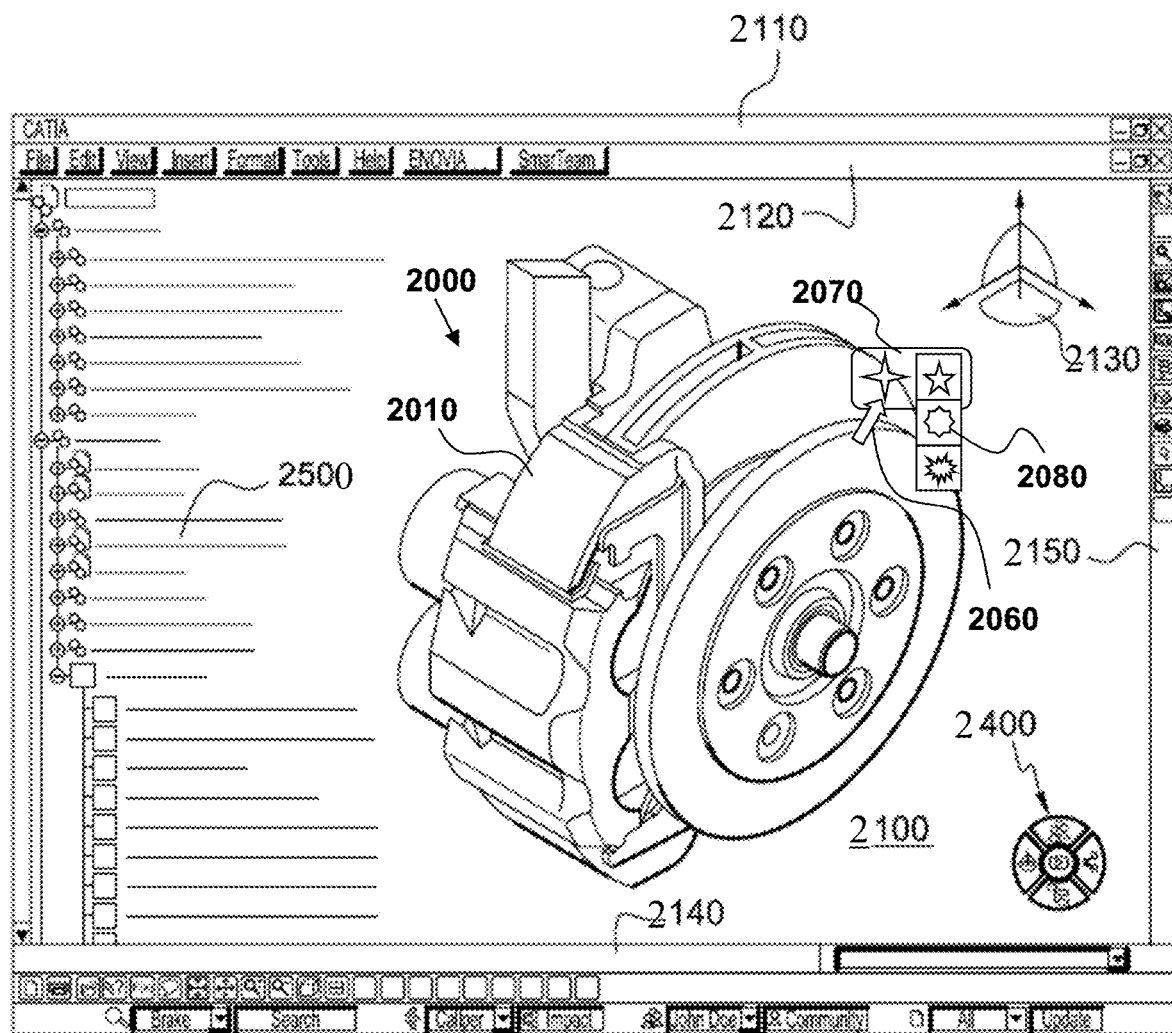
FIG. 1 shows an example of a graphical user interface of the system.

It is hereby proposed computer-implemented methods related to the learning of a neural network. The neural network is herein a function configured to take as an input any one of freehand drawings each representing a respective 3D shape, to process the input, and as a result of the processing to output respective data configured for inference of a solid CAD feature representing the 3D shape respective to the input. Such a neural network may thus be used for inference of a solid CAD feature corresponding to a freehand drawing representing a 3D shape.

It is thus proposed a computer-implemented method for performing such an inference, which may be referred to as "the inference method".

The inference method may comprise providing a freehand drawing representing a 3D shape. The inference method may further comprise applying the neural network to the freehand drawing. The inference method may also comprise inferring (e.g. substantially real-time upon the applying) at least one solid CAD feature representing the 3D shape based on a result of the applying (i.e. data output by the neural network when inputted with the freehand drawing). The output data may (directly) include the solid CAD feature, and/or be processed to (indirectly) determine the solid CAD feature, for example automatically and/or according to a predetermined algorithm.

In the indirect determination case, the output data may for example comprise one or more probability distributions for selecting values that define the at least one solid CAD feature, and the predetermined algorithm may for example comprise determining at least one solid CAD feature based on the one or more probability distributions. The determining may for example penalize selecting values with a low probability, e.g. by selecting one or more most probable value(s) based on the one or more probability distributions. The determining may then derive one or more elements (e.g. geometrical shapes) of a solid CAD feature each corresponding to respective one or more selected values.

In examples, the determining may further comprise modifying one or more of the elements. For example, the inferred solid CAD feature may include a respective sequence of geometrical shapes (e.g. curves). In such examples, the modifying may comprise modifying geometry of one or more geometrical shapes (e.g. curves) of the respective sequence. In particular examples, the inferring may be restricted to a respective sequence of geometrical shapes (e.g. curves) which is closed (e.g. the curves form a cycle). In such particular examples, the modifying of geometry of one or more geometrical shapes (e.g. curves) of the sequence may comprise closing the respective sequence.

As known from the field of machine-learning, the processing of an input by the neural network includes applying operations to the input, the operations being defined by data including weight values. The learning of the neural network thus includes determining values of the weights based on a dataset configured for such learning. For that, the dataset includes data pieces each forming a respective training sample. The training samples represent the diversity of the situations where the neural network is to be used after being learnt. Any dataset referred herein may comprise a number of training samples higher than 1000, 10000, 100000, or 1000000.

It is thus notably proposed a computer-implemented method for forming such a dataset, which may be referred to as "the dataset-forming method". It is also proposed a computer-implemented method for performing such a learning, which may be referred to as "the learning method".

A machine-learning process may comprise the dataset-forming method and/or the learning method, and optionally the inference method.

A machine-learning process may notably comprise both the dataset-forming method and the learning method. The learning method may for example be performed at least partly based on the dataset formed by the dataset-forming method, in examples after the dataset-forming method. Such a machine-learning process is particularly efficient and provides improved accuracy.

Alternatively, a machine-learning process may comprise the dataset-forming method and performing, based on the dataset, any other computer-implemented method (than the proposed learning method) for learning the neural network.

Yet alternatively, a machine-learning process may comprise performing the learning method on a dataset provided by any other computer-implemented method (than the proposed dataset-forming method), such as another method for forming a dataset or a retrieval of a dataset as such.

Before presenting the dataset-forming method and the learning method, data structures involved therein are now discussed. As will be recognized, the data structure definitions and examples provided herein may apply to at least part (e.g. all) of the dataset formed by the dataset-forming method and/or at least part (e.g. all) of the dataset provided in the learning method, and/or to at least one input and/or at least one output of the inference method.

A solid CAD feature is a 3D modeled object representing 3D shape of a solid. Any 3D shape herein represents a 3D spatial distribution of material constitutive of a solid. A 3D modeled object may represent a skin (i.e. outer surface) of the solid. A 3D modeled object may be provided to a CAD system for being displayed to a user and/or for the user to perform one or more CAD design operations on the 3D modeled object.

A modeled object is any object defined by data stored e.g. in a database. By extension, the expression "modeled object" designates the data itself. According to the type of the system used for designing the modeled object, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "30 modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

Any 3D shape herein may represent the geometry of a product to be manufactured in the real world, such as a (e.g. mechanical) part or assembly of parts (or equivalently an assembly of parts, as the assembly of parts may be seen as a part itself from the point of view of the methods, or the methods may be applied independently to each part of the assembly), or more generally any rigid body assembly (e.g. a mobile mechanism). The product may be one of products in various and unlimited industrial fields, including: aerospace, architecture, construction, consumer goods, high-tech devices, industrial equipment, transportation, marine, and/or offshore oil/gas production or transportation. The 3D shape may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

As known from the field of CAD, a solid CAD feature representing a 3D shape is herein a list of one or more instructions allowing a CAD system to generate the 3D geometry of a solid, and for example to render and display a 3D graphical representation of the solid. The 3D graphical representation may comprise a 3D tessellation of the outer surface of the solid, for example a—e.g. polygonal, optionally triangular—mesh tessellation. The mesh tessellation may in examples comprise a number of faces—e.g. polygons, optionally triangles—higher than 100 (e.g. higher than 1000).

As known from the field of CAD, a solid CAD feature is selectable and/or editable by a user of the CAD system. The list of one or more instructions may involve one or more elements each selectable and/or modifiable. Edition of a solid CAD feature may be performed by a user in any manner known from the field of CAD, such as comprising selection of at least one element thereof and/or deletion or modification of the element, and/or addition of at least one new element. Such edition presents ergonomics characteristics compared to edition of a discrete geometrical representation such as a mesh.

In particular, the list of instructions may represent one or more constraints involving one or more parameterized geometrical shapes to create a solid. Each parameterized geometrical shape comprises respective one or more parameters, e.g. including a type parameter and/or one or more shape parameters. One or more parameters may be selectable and/or editable (e.g. comprising at least one—e.g. each—shape parameter). Edition of a parameter may comprise modifying a value of the parameter. In such cases, an inferred solid CAD feature may involve a number of geometrical shapes lower than the number of faces of its tessellated mesh by a factor higher than 5 (e.g. higher than 10), and/or a number of geometrical shapes lower than 50 (e.g. lower than 20) Each geometrical shape may be defined by a number of parameters lower than 20 (e.g. lower than 10). The solid CAD feature thus represents the 3D shape in a more compact and organized manner compared to the mesh. Also, as known from the field of CAD, acting on a single element of the solid CAD feature may present a global impact, while in the case of a mesh, acting on a single geometrical entity only presents a local impact. For example, any solid CAD feature herein may be configured for scaling up a (e.g. curved, for example cylindrical) its represented 3D shape by modifying a number of parameter values inferior to 5 (e.g. inferior to 3), as opposed to moving/increasing a high number of mesh triangles. In addition, a solid CAD feature is semantically more meaningful to a user than a discrete geometrical representation.

For any solid CAD feature herein, the list of instructions may represent one or more live/declarative constraint(s) and/or one or more procedural constraints. For any solid CAD feature herein, the geometrical shapes may comprise geometrical 3D shapes, that is, geometrical shapes defined in a 3D space. The 3D shapes may for example comprise 3D curves and/or any other 3D shapes (such as 3D points and/or 3D solids). Any 3D curve herein may be planar (i.e. defined in a 3D space but contained in a plane of said 3D space) or non-planar (i.e. not contained in any plane). In examples, for any solid CAD feature herein, the geometrical shapes may comprise one or more sequences of geometrical shapes, for example one or more (e.g. closed) sequences of (e.g. planar) 3D curves (e.g. sequence curves). A sequence of planar 3D curves resulting in a closed contour (necessarily in a plane containing each of the curves) is called a "closed 2D planar sketch". In examples, for any solid CAD feature herein, the geometrical shapes may alternatively or additionally comprise one or more sweep operations, each taking as input one or more geometrical objects (e.g. a single closed 2D planar sketch) and/or based on another geometrical object (e.g. a 3D curve). Any sweep operation herein may for example be defined by a 3D curve (e.g. sweep curve), optionally non-planar.

Any 3D curve herein may belong to a class (referring to object-oriented programming) defined by one or fields each corresponding to a respective parameter defining the shape of the 3D curve in the context of the class. Any 3D curve herein may notably be defined by one or more shape parameters, for example including one or more positioning parameters (e.g. 3D coordinates) for one or more bounding (e.g. starting and/or ending) points. Any 3D curve herein may alternatively or additionally be defined by a type parameter (e.g. among curves types comprising a line type, an arc type, and/or a cubic Hermite interpolated segment type). Any 3D curve herein may alternatively or additionally be defined by additional shape parameters depending on its type, optionally including one or more positioning parameters (e.g. 3D coordinates) for each respective one among one or more intermediary points of the curve and/or one or more tangent vector parameters (e.g. 3D vector definition) for each respective one among one or more points of the curve (e.g. including the starting point and/or the ending point). Such parameterization of 3D curves is particularly ergonomic for a user to edit.

In particularly efficient examples in terms of accuracy and robustness of the learning and diversity of the situations represented with respect to the contemplated application to freehand drawings, any solid CAD feature herein may specifically be defined by (and only by), relative to a given 3D space:

- a closed 2D planar sketch, composed by a sequence of planar curves (e.g. sequence curves) resulting in a closed contour,
- followed by a sweep operation (e.g. defined by a sweep curve) generating a solid by sweeping the closed surface defined by the 2D planar sketch in the 3D space, i.e. the solid is defined by the volume that the closed surfaced goes through.

In such particularly efficient examples, a solid CAD feature has meaningful parameters and can be easily edited. For example, the base 2D planar sketch may be modified and the final geometry may be automatically updated by applying the sweep operation to the new base. The edition may comprise selecting and editing a parameter of a respective 3D curve (e.g. a 3D curve constitutive of the closed 2D planar sketch or the 3D curve defining the sweep operation). The edition may be constrained by the plane and/or a requirement that the sequence be not modified and/or remain closed. Such a type of solid CAD feature is particularly ergonomic to edit for a user.

In examples, the inference method may comprise displaying a 3D graphical representation of the 3D shape represented by the solid CAD feature (i.e. the 3D shape obtained by executing the list of instructions of the solid CAD feature), for example a 3D tessellation thereof. The inference method may additionally comprise displaying a graphical representation of the solid CAD feature's structure, for example including a tree arrangement of graphical items representing each a corresponding geometrical shape or geometrical operation, or a highlighting on the 3D graphical representation of geometrical shapes involved in the solid CAD feature. The edition of the solid CAD feature may comprise selecting a graphical item, for example by graphical-interaction. Graphical-interaction herein means operating a haptic device to activate pixels at a location corresponding to the position of the graphical item on the display. For example, a mouse cursor may be positioned over the displayed graphical item, or the displayed graphical item may be touched directly via a touch screen or indirectly via a touch pad. The selection may trigger opening of a dialog box or the like, and entering one or more parameter values by the user, for example via a keyboard. In the particularly efficient examples of solid CAD features, the graphical interaction may comprise a drag-and-drop action on a graphical representation of a point or of a vector linked to a 3D curve, to move position of the point and/or modify the vector's direction and/or size, for example constrained in the plane when the 3D curve belong to the closed 2D planar sketch. This type of ergonomic edition is widely known from the field of CAD.

In examples, alternatively or additionally to user-editing the inferred solid CAD feature, the inference method may comprise combining, e.g. via user-interaction, the solid CAD feature to one or more other solid CAD features. For example, the inference method may comprise adding the solid CAD feature to an existing feature tree comprising the one or more other solid CAD features, e.g. by connecting the solid CAD feature to any node of the feature tree. Optionally, the inference method may further comprise editing one or more solid CAD features of the feature tree. In particular examples, the inference method may be repeated and comprise providing several freehand drawings, and inferring several solid CAD features each by applying the neural network to a respective freehand drawing. In such particular examples, the inference method may then comprise combining the inferred solid CAD features in a single feature tree. These particular examples allow ergonomically creating a feature tree and thus performing a complex CAD design, based on freehand drawings. Any feature tree herein may be a Constructive Solid Geometry (CSG) tree.

The CAD system may be history-based. In this case, a modeled object may be further defined by data comprising a history of geometrical features. A modeled object may indeed be designed by a physical person (i.e. the designer/user) using standard modeling features (e.g. extrude, revolute, cut, and/or round) and/or standard surfacing features (e.g. sweep, blend, loft, fill, deform, and/or smoothing). Many CAD systems supporting such modeling functions are history-based system. This means that the creation history of design features is typically saved through an acyclic data flow linking the said geometrical features together through input and output links. The history based modeling paradigm is well known since the beginning of the 80's. A modeled object may be described by two persistent data representations: history and B-rep (i.e. boundary representation). The B-rep is the result of the computations defined in the history. The shape of the part displayed on the screen of the computer when the modeled object is represented is (e.g. a tessellation of) the B-rep. The history of the part is the design intent. Basically, the history gathers the information on the operations which the modeled object has undergone. The B-rep may be saved together with the history, to make it easier to display complex parts. The history may be saved together with the B-rep in order to allow design changes of the part according to the design intent. The inference method of the particular examples allows retrieving such a history of geometrical features via the feature tree, in an ergonomic manner thanks to the freehand drawing approach.

A mechanical simulation may be performed based on the solid CAD feature and/or feature tree. Indeed, since the solid CAD feature and/or the feature tree forms a compact and parameterized representation of a 3D shape in a compact (relative to the discrete geometrical representation), mechanical computations may be performed more accurately. In particular, it is easier and more direct to calculate a finite element mesh from a CSG (as taught by paper "Finite-element mesh generation from constructive-solid-geometry models", Edwin Boender, Willem F. Bronsvoort, Frits H. Post, in Computer-Aided Design, Volume 26, Issue 5, May 1994, Pages 379-392 or by paper "Finite element mesh generation methods: a review and classification", K Ho-Le, in 38 Computer-Aided Design, volume 20 number 1 January/February 1988). In addition, the CSG offers guarantees of waterproofness of the surface. The mechanical simulation may thus comprise computing one or more finite element meshes from the solid CAD feature and/or feature tree (e.g. CSG) and/or one or more modifications thereof, and then performing a finite element analysis based on each finite element mesh. Also, one can easily optimize a solid CAD feature according to the results of simulation since the solid CAD feature is parameterized. Thus, the one or more modifications may be for optimizing a solid CAD feature based on each previous finite element analysis result.

Any freehand drawing herein representing a 3D shape is a 2D image designable freehand by a (human) user for representing the 3D shape. By "designable freehand", it is meant that the drawing presents characteristics of a 2D image sketched by a user. A freehand drawing may thus have been established by a user, but alternatively it may have been synthetized, i.e. artificially and automatically by a computer system. In particular, the freehand drawings in the dataset-forming method may be synthetic. On the other hand, it is intended that the freehand drawings in the inference method be effectively drawn freehand by a user, although the inference method could also be fed with synthetic freehand drawings.

A freehand drawing is thus a 2D image data structure which comprises one or more (2D planar) strokes representing a 3D shape from a respective viewpoint from where the 3D shape is visible. The one or more strokes are defined in a same plane and represent a perspective of the 3D shape from the respective viewpoint. Each stroke is a continuous or substantially continuous curve defined in the plane.

In examples, for any freehand drawing herein, the one or more strokes may comprise a number of strokes lower than 20 (e.g. lower than 10) strokes, optionally higher than or equal to 2. In examples, for any freehand drawing herein, one or more strokes may each represent a respective characteristic edge of the 3D shape from the viewpoint, for example a contour edge or a visible edge of the solid represented by the 3D shape. By "visible edge", it is meant an edge of the solid which by action of light reflection is remarkable to the user. Visible edges of any solid herein may include (e.g. only) one or more edges each forming a $C^k$ discontinuity of the solid representation, k being an integer higher than or equal to 1 (e.g. and optionally lower than 10 or 4).

In examples, for any freehand drawing herein, one or more (e.g. all) strokes may each have an extremity point having a distance from another stroke (e.g. from an extremity point of another stroke), for example lower than a predetermined threshold, for example 10 or 5 mm. This represents the fact that, when sketching a freehand drawing, the user may intend to join in this manner the extremity point to said another stroke (e.g. said extremity point of another stroke) to represent 3D in 2D. In examples, for any freehand drawing herein (e.g. one or more freehand drawings inputted to the inference method and/or one or more freehand drawings of the dataset), one or more (e.g. all) strokes may each have an extremity point having a non-zero distance (i.e. a positive gap) from another stroke (e.g. from an extremity point of another stroke). This represents the fact that, when sketching a freehand drawing, the user may often fail at joining perfectly the extremity point to said another stroke (e.g. said extremity point of another stroke), thereby creating a gap. This is because the user is sketching freely and thus fast/ergonomically. Despite this imprecision, the inference method may infer accurately the solid CAD feature. And the dataset may represent this imprecision for the learning to be accurate.

In examples, for any freehand drawing herein, the strokes represent freely the 3D shape. This means that they can be defined in any order and with no predefined constraint (such as having necessarily parallel and/or orthogonal strokes), and they are not organized in clusters (e.g. obtainable based on distance) each representing a planar face of the solid. In examples, for any freehand drawing herein, one or more strokes may alternatively or additionally each be irregular. This means that the stroke cannot be represented by a parameterized 2D curve (at least one of any of the types described herein), without approximating the stroke and thus introducing an error. Since the strokes are intended to be sketched by a user, in the general case they do not form canonical geometry. In examples, the irregular strokes are allowed to be particularly/significantly irregular. In examples, any freehand drawing herein may alternatively or additionally be provided in a raw format, e.g. without any label associated to the strokes (e.g. action annotation, such as creation, extrusion, bending) and/or without any additional data (e.g. pictures, user-definition of parallel lines, depth images). The inference method is thus ergonomic, as the user is not bound by any constraint and can sketch the strokes freely (e.g. the inference method does not make any assumption on 2D sketch planes), and since no additional input is required other than the input freehand drawing.

At inference, each stroke is unparameterized, which means that the data structure representing the stroke comprises pieces of data each representing a respective portion (e.g. a pixel) of the stroke, the data structure representing a raw aggregation of these portions. The inference method may comprise by the user, sketching each stroke of the input freehand drawing. The sketching may be performed by graphical-interaction with a screen of the computer, by activating sequentially (e.g. substantially continuously) a series of pixels of the screen defining the stroke. The activation may be performed via a haptic device acting on the pixels, such as a mouse (e.g. the cursor movement defining the stroke) or via user-interaction with a touch-screen or a touch-pad (e.g. the interaction comprising physically touch-drawing the stroke on the touch-screen or touch-pad). This is well-known in the field of CAD as sketch-design or stroke-design. In alternatives, a scan of a paper-sketched drawing or any other image may be inputted to the inference method. Yet alternatively, the freehand drawing may be retrieved from memory or received from a distant computer system, e.g. having been produced by another user and/or by any of the previously-described techniques.

In examples, the inference method may comprise displaying (e.g. real-time) a graphical representation of the freehand drawing as a user sketches the strokes. The inference method may trigger application of the neural network. For example, when the user has finished, the user may trigger application of the neural network and inference of the solid CAD feature. The method may as a result, display a 3D graphical representation of the solid CAD feature, optionally while still simultaneously displaying the graphical representation of the freehand drawing. The user may then hide the graphical representation of the freehand drawing for processing (e.g. edition, integration to a tree, simulation) of the solid CAD feature. The inference method may be performed while displaying a complex 3D modeled object designed by the user, optionally including repeating the inference method as above. The inference method thus provides a sketch-based design capability to a history-based CAD system.

Any method herein may thus be part of a process for designing a 3D modeled object including a solid CAD feature, in particular, the inference method. "Designing a 3D modeled object" designates any action or series of actions which is at least part of a process of elaborating a 3D modeled object. Thus, the method may comprise creating the 3D modeled object from scratch. Alternatively, the method may comprise providing a 3D modeled object previously created, and then modifying the 3D modeled object.

Any method herein may be included in a manufacturing process, which may comprise, after performing the method, producing a physical product corresponding to the modeled object. In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process.

The dataset-forming method and the learning method are now presented in general.

The dataset-forming method comprises generating (e.g. synthesizing) one or more solid CAD feature includes each representing a respective 3D shape. The dataset-forming method further comprises, for each solid CAD feature, determining (e.g. synthesizing) one or more respective freehand drawings each representing the respective 3D shape (e.g. based on the generated solid CAD feature), and inserting in the dataset, one or more training samples each including the (e.g. synthesized) solid CAD feature and a respective (e.g. synthesized) freehand drawing.

By "providing/generating/determining/synthesizing a respective data piece", it is implied that at least at some point, the data piece is recorded on memory of the computer system and accessible to the processor.

By "dataset", it is meant any data structure comprising training samples and configured for machine-learning, the data structure being recorded on memory of the computer system and accessible to the processor. The dataset-forming method may comprise recording the dataset on non-volatile memory.

By "inserting" or "not inserting" a data piece in the dataset as a training sample, it is meant that at least at some point (e.g. the end) of the dataset-forming method, the dataset is recorded on (e.g. non-volatile) memory of the computer system in a state where the dataset includes all "inserted" data pieces (i.e. which are thus recorded on the memory within the data structure representing the dataset) while the dataset excludes (i.e. does not comprise) all "not inserted" data pieces (i.e. which are thus not recorded on the memory, at least within the data structure representing the dataset). Learning may then be based on the dataset, in examples after a further processing of the dataset. The learnt neural network will thus be consistent with the data pieces inserted in the dataset.

The dataset-forming method forms an improved solution for CAD design. The formed dataset comprises training samples each including a freehand drawing of a respective 3D shape and a respective solid CAD feature representing the 3D shape. The dataset is thus configured for learning a neural network usable for converting a freehand drawing into a solid CAD feature, in examples with the proposed learning method. In addition, the dataset is labeled with respect to the contemplated learning. Indeed, potential inputs of the neural networks (freehand drawings) are each labeled in the dataset by a ground truth output (a respective solid CAD feature). Thus, the learning may be supervised and thus particularly efficient.

The learning method comprises providing a dataset including freehand drawings each representing a respective 3D shape, and learning the neural network based on the dataset.

The learning method forms an improved solution for CAD design. Notably, the learnt neural network is usable for converting a freehand drawing into a solid CAD feature. In the context of CAD, this is particularly useful as already discussed. In addition, performing such a conversion with a learnt neural network allows achieving benefits provided by the field of machine-learning, such as fast or real-time execution, non-requirement of tedious prior manual programming/coding, and accuracy of the result (e.g. the accuracy here referring to the value of a 3D similarity evaluated between the result of executing the solid CAD feature and the 3D shape intended by the user when sketching a freehand drawing, e.g. optionally measured as the value of a 2D similarity evaluated between a 2D projection of (e.g. characteristic edges of) the result of executing the solid CAD feature and the freehand drawing). The learning method thus improves ergonomics in the context of 3D design.

The learning may comprise a supervised training, based on at least part of the dataset. In such a case, said at least part of the dataset includes, for each freehand drawing, a respective solid CAD feature forming with the freehand drawing a (labeled) training sample. Said at least part of the dataset may be provided according to any method, for example formed according to the dataset-forming method.

Alternatively or additionally, the learning may comprise an unsupervised training, based on at least another part of the dataset. In such a case, the freehand drawings of said at least another part of the dataset each form a respective (unlabeled) training sample. Said at least another part of the dataset may be provided according to any method, for example retrieved as a commercial database of freehand drawings.

In particularly efficient examples, the learning method may comprise a supervised training based on the dataset formed by the dataset-forming method. In robust examples of such examples, the learning may further comprise an unsupervised training based on another dataset, for example after the supervised training. As known from the field of machine-learning, each training may comprise iteratively processing a respective dataset, for example mini-batch-by-mini-batch, and modifying weight values of the neural network along the iterative processing. This may be performed according to a stochastic gradient descent. The weight values may be initialized in any way for each training. In examples, the weight values of the unsupervised training may be initialized with the weight values obtained at the end of the supervised training. The weight values may be initialized for the supervised training in any arbitrary manner, for example randomly or each to the zero value. The dataset-forming method and the supervised training thus form a way to initialize weight values for a further training, namely the unsupervised training, which may be based on another dataset. The other dataset may for example be an unlabeled dataset more representative of reality than the labeled dataset formed by the dataset-forming method. The unsupervised training may thus lead to a more accurate result compared to stopping after the supervised training. However, as known from the field of machine-learning, an unsupervised training can be very long and provide an inaccurate result if arbitrarily initialized. In the proposed approach, the supervised learning provides a relatively good initialization.

The methods are computer-implemented.

This means that steps (or substantially all the steps) of the methods are executed by at least one computer, or any system alike. Thus, steps of the methods are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

This also means that the neural network, the dataset, one or more (e.g. all) inputs and/or one or more (e.g. all) outputs may each be represented by a respective data structure. One or more (e.g. all) data structures may each be non-transitorily recorded on a respective data storage medium.

A typical example of computer-implementation of a method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database). The system may be a CAD system.

FIG. 1 shows an example of the GUI of any system herein, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen. The GUI may for example display data 2500 related to the displayed product 2000. In the example of the figure, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

The 3D modeled object 2000 may be a graphical representation of a discrete geometrical representation of a 3D shape, and the inference method may allow determining any solid CAD feature of the editable feature tree 2500. The inference method thus allows editing the editable feature tree 2500 (e.g. adding solid CAD features) and simultaneously updating the discrete geometrical representation 2000 of a 3D shape, based on a 2D sketch functionality of the CAD system. This presents high ergonomics.

Figure 2:
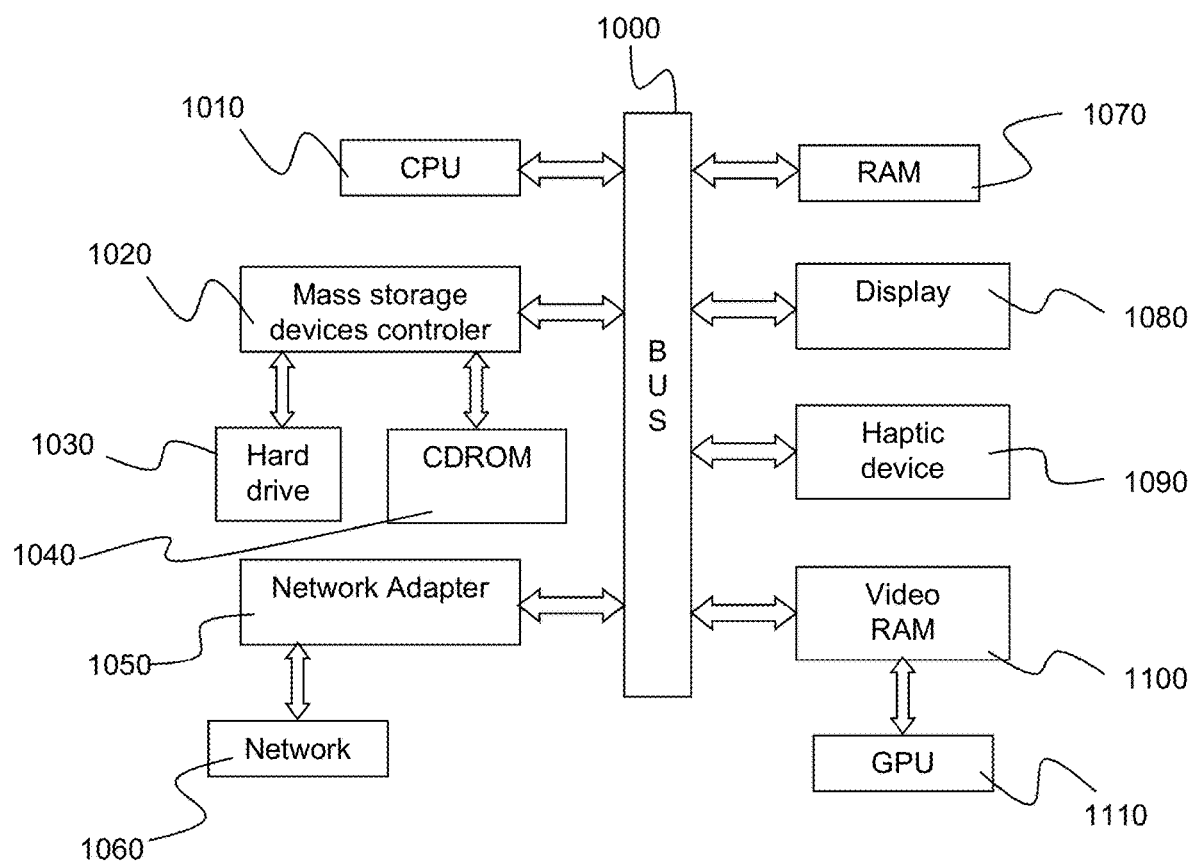
FIG. 2 shows an example of the system.

FIG. 2 shows an example of any system herein, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

Any computer program herein may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

Examples presented above of solid CAD features including a respective (e.g. closed) sequence of curves and/or a sweep operation (e.g. defined by a sweep curve) is now further discussed.

One or more (e.g. all) solid CAD features generated in the dataset-forming method, one or more (e.g. all) (e.g. candidate) solid CAD features provided in the learning method, and/or one or more (e.g. all) solid CAD features provided by the inference method may each be in line with these examples.

In such examples, the learning method may comprise providing a candidate set of sequence curves and/or a candidate set of sweep operations for example a candidate set of sweep curves (e.g. a common candidate set of curves), the learning being further based on the candidate set of curves and/or on the candidate set of sweep operations. By "providing a candidate set", it is meant that the learning method, and in particular the learning step, is enabled to consider each element of said candidate set as a candidate for inference (at least at some point). As known from the field of machine-learning, the learning step may comprise setting the weight values of the neural network freely such that the inference method tends to perform inference consistent with the dataset fed to the learning method. And by "providing a candidate set of curves/sweep operations", it is meant that the neural network architecture is predetermined in a way and the learning step is performed in a manner such that each element of the candidate set is available for being potentially inferred during inference. In examples, each element of the candidate set is a candidate for each inferred solid CAD feature. In particular, each element of the candidate set of curves may be a candidate for each inferred curve of the sequence of curves.

The candidate set of curves and/or the candidate set of sweep operations may each comprise at least one continuous subset of curves (resp. sweep operations). By "continuous", it is meant that each element of the subset can be obtained by a particular continuous deformation (e.g. parameterized with a fixed number of parameters) of another element of the subset, such that each intermediate state of the continuous deformation is itself a candidate element. In examples, each candidate set comprises several continuous subsets (e.g. one per curve type). This improves accuracy of the learning. Indeed, since at least one continuum of elements are all accessible for becoming elements of an inferred solid CAD feature, the inference can be performed in a fine manner within such continuum.

Examples of curves of the sequence of curves (e.g. planar 2D curves, i.e. sequence curves) and/or of a curve defining the sweep operation (e.g. sweep curve) are now discussed. The data structures involved may optionally be the same for each sequence curve and/or for the sweep curve.

Given a discrete set of curve types and, for each curve type, a respective discrete set of one or more parameter domains each of a respective (e.g. continuous) parameter, where each parameter domain has respective parameters values of the respective continuous parameter, a curve may be formed by a respective curve type, with a respective parameter value for each of the respective discrete set of one or more parameter domains.

Thus, the dataset-forming method and/or the learning method may be based on such a discrete set of curve types, and, for each curve type, on such a respective discrete set of one or more parameter domains. The sets may be the same or different for the dataset-forming method and the learning method. In case the sets are the same, the machine-learning process is particularly accurate, since the curves of the training samples are consistent with the curves which are candidates for inference.

Now, the candidate set of curves in the learning method may comprise a set product between the discrete set of curve types, and for each curve type, the respective discrete set of one or more parameter domains. Each element of the set product represents a respective candidate sequence/sweep curve.

In the case of the dataset-forming method, each sequence/ sweep curve of a training sample may belong to such a set product. In examples, the dataset-forming method may comprise providing initial data including (data representative of) the discrete set of curve types, and, for each curve type, (data representative of) the respective discrete set of one or more parameter domains. In such examples, sequence curves and/or sweep curve may be generated (e.g. synthetized) based on such initial data.

By "curve type" it is meant a class of curves (e.g. 2D planar for sequence curve, 3D for sweep curve) where each curve presents a common general form (e.g. recognizable as such to a user). A curve type is associated with parameters. Each parameter takes values in a set called "parameter domain" (which may be an interval, i.e. a continuous range of real numbers), and providing a particular parameter value for each parameter domain defines an instance of the curve type. A curve type may be defined by a respective set of one or more parameters and a predetermined algorithm configured for generating such a curve instance of the curve type when fed with parameter values for the respective set. Said instance forms a sequence curve or a sweep curve which can intervene in one or more solid CAD features.

The curve types may be associated each with one or more continuous parameters. By "continuous" for a parameter, it is meant that the function outputting the curve is continuous at least piecewise with respect to the parameter. It can also be said that the parameter domain is continuous at least piecewise. This allows a compact representation of a great diversity of shapes.

In examples, for each of one or more curve types, the one or more respective continuous parameters comprise one or more shape parameters as earlier-described, for example including a positioning parameter for a starting point of the curve and a positioning parameter for an ending point of the curve, and optionally one or more additional parameters depending on the curve type (e.g. including one or more intermediary point positioning parameters and/or one or more tangent vectors each constraining the curve at a respective—e.g. boundary—point of the curve). Positioning parameters may be the same for all curve types, for example (x, y, z) coordinates defined relative to a (0, X, Y, Z) referential.

In particularly efficient examples in terms of computation time and/or convergence for the learning Versus representativity of the diversity of real situations, the discrete set of curve types may comprise a line type, an arc type, and/or a cubic Hermite interpolated segment type, optionally consist of a line type, an arc type, and a cubic Hermite interpolated segment type. The discrete set of curve types may comprise any other curve type.

Any curve provided herein (e.g. on a memory) may be recorded (e.g. within a provided data piece, a training sample and/or an output of the inference) as a data structure including a datum (e.g. textual information) representative of the curve type, and for each parameter, a respective datum (e.g. a value, such as a floating point) representative of the parameter value. Any curve provided herein may be post-processed, e.g. represented, rendered and/or displayed in a vectorial way (for example by dividing the curve into sub-curves, and/or approaching the curve with one or more Bézier and/or spline curves e.g. each for a respective portion of the curve, e.g. under the svg format for 2D curves).

Examples of the dataset-forming method are now discussed.

In examples, the providing of respective training samples may comprise synthetizing data pieces. By "synthetizing" a solid CAD feature and/or a freehand drawing (e.g. a training sample), it is meant an automatic process that includes generating a solid CAD feature and/or determining at least one respective freehand drawing (e.g. representing the 3D shape represented the solid CAD feature).

In examples, the dataset-forming method may comprise providing initial data comprising the discrete set of curve types and, with each curve type, the respective discrete set of one or more parameter domains. This means that the initial data comprise for each curve type a respective data structure corresponding to an object class (referring to object-oriented programming) with fields corresponding to the parameters of the curve type. In such cases, synthetizing the solid CAD features may be performed based on the initial data. For example, the generating of at least one respective solid CAD feature may include synthetizing the solid CAD feature based on the initial data. The synthetizing may include generating an integer representing a number of curves of a sequence, and, generating, based on the initial data, a number of sequence curves corresponding to the integer, e.g. the generation being constrained by the requirement(s) of the solid CAD feature definition, e.g. that each curve be planar and/or in a same plane, that the curves be sequential (i.e. the ending point of a curve being the starting of a next curve), and/or that the sequence be closed (i.e. the sequence is cyclic). The generating may further include generating a sweep curve based on the initial data.

In particular, the generating of each sequence/sweep curve may comprise selecting a curve type, and selecting a parameter value for each parameter of the curve type. This corresponds to creating an instance of a given class.

Any selection performed when synthetizing a solid CAD feature may be performed via a (e.g. random) sampling. This allows generating data representing relatively well the diversity of real situations. This thus leads to an eventually accurate learning. Any (e.g. random) sampling may comprise a uniform (e.g. random) sampling within the set where the variable to be selected takes values (e.g. a random uniform sampling being a random sampling according to a uniform probability distribution).

For example:
The length of the curve sequence may be sampled according to a uniform distribution on a set of all integers higher than N1 and lower than N2, where N1 is a 'minimal depth' integer, higher than 0 and/or lower than 5, for example equal to 1, and N2 is a 'maximum depth' integer higher than N1 and/or lower than 100, 50, or 20, for example equal to 10.
The sequence/sweep curve type may be sampled according to a uniform distribution on the discrete set of curve types.
The parameter values for each selected curve type may be sampled in any manner, e.g. with parameter domains being provided directly or indirectly (for example in the initial data) each with one or more intervals (e.g. each interval having a upper bound e.g. floating point and a lower bound e.g. floating point), e.g. respecting the requirement(s) for the sequence curves.

The synthetizing may further comprise determining of each freehand a scheme to determine one or more plausible freehand drawings.

The scheme comprises providing a viewpoint (i.e. a 3D position in the 3D space where the solid CAD feature is defined) from which the respective 3D shape (represented by the synthetized solid CAD feature) is visible, and rendering in an image one or more edges based on the viewpoints. The scheme may optionally comprise providing a perspective, or the perspective may be predetermined (for example a default conical perspective).

The viewpoint may be provided in any manner, for example sampled (e.g. randomly and/or uniformly) in a set of candidate viewpoints, for example the set of all points of a sphere surrounding the 3D shape.

The edges define location of plausible strokes of a freehand drawing of the 3D shape. For example, relative to a solid representation of the respective 3D shape based on the solid CAD feature (i.e. corresponding to executing the solid CAD feature), each edge may be either a contour edge or a visible edge of the solid representation from the viewpoint. Contour and/or visible edges may be determined in any manner based on the viewpoint.

Visible edges may in examples be considered as one or more (e.g. all) edges lying on the 3D shape (thus possibly including non-planar edge(s)), accessible from the viewpoint (not occluded by the 3D shape to the viewpoint), and which correspond to a curve on the solid representation with a $C^k$ discontinuity of the solid representation. k is an integer higher than or equal to 1. k may optionally be lower than 10 or 4. In examples, the scheme may comprise providing or be based on a maximal discontinuity value $k_{max}$ (e.g. $k_{max}=2$), and computing all edges forming a discontinuity $C^k$ discontinuity of the solid representation with k higher than or equal to 1 lower than or equal to $k_{max}$. This allows extracting visible tangent discontinuities (i.e. sharp edges) and/or visible curvatures discontinuities, such discontinuities being naturally represented by a freehand sketch. This thus allows populating the dataset with realistic data.

In examples, the determining of each freehand drawing further comprises perturbating at least part of the one or more rendered edges. In other words, rendered edges may be modified after having been rendered from the viewpoint. This allows reproducing the irregularity of a freehand sketch, whereas the rendering starting from a solid CAD feature produces geometry which is too regular. This thus makes the learning more accurate and robust.

As mentioned earlier, the rendering of each edge may be performed in a vectorial way. In other words, each edge may be represented by one or more respective parametric curves, for example having less than 50, 20, or 10 control points. Bézier curves are represented in a 2D image under the svg format. Other formats may be used. In such a case, the perturbating may comprise, for at least one respective parametric curve, adding a noise to one or more parameters of the at least one respective parametric curve. For example, the noise may move the control points. This makes the learning particularly robust.

Examples of the learning method are now discussed.

The neural network may in examples comprise recurrent neural network (RNN) cells (i.e. cells of a same RNN). Such examples allow learning an accurate neural network and thereby perform accurate inferences, the neural network presenting a sequential architecture (via the RNN) corresponding to the sequential character of the sequence of geometrical shapes (e.g. curves) of the solid CAD feature to be inferred.

In particular, each RNN cell may output at a respective time step, respective data for inference of a respective geometrical shape (e.g. sequence curve) of the solid CAD feature. The outputted data thus allow inference of a respective curve. The length of the curve sequence may be inferred in any manner, predetermined (e.g. the inferred curve sequence may be restricted to curve sequences having a certain given length). Alternatively, each RNN cell may further output at a respective time step, respective data for inference of an end-or-continuation-decision (i.e. end token) for the curve sequence.

Particularly efficient examples of the RNN outputs are now discussed.

The respective data for inference of a respective curve of the solid CAD feature may comprise respective first data for inference of a respective curve type and respective second data for inference of a respective parameter value for each of the respective discrete set of one or more parameter domains.

In examples, the respective first data may comprise a respective discrete distribution of probabilities each attributed to a respective one of the discrete set of curve types. In other words, each RNN cell outputs a distribution of probabilities over the curve types, such that a probable curve type may be inferred for a sequence curve corresponding to the respective time step.

Alternatively or additionally, in examples, the respective second data may comprise (for each curve type) a respective parameter value for each of the respective discrete set of one or more parameter domains. In other words, the RNN cells directly output the parameter values for the inferred curve types. This simplifies the learning and improves convergence and accuracy, in particular when the parameters are continuous and it is difficult to learn a neural network outputting a density distribution.

Similarly, the neural network may in examples comprise a standard neural network (NN) part outputting data for inference of the sweep operation of the solid CAD feature. In examples, the data for inference of the sweep operation of the solid CAD feature may comprise first data for inference of a sweep curve type and second data for inference of a parameter value for each of the respective discrete set of one or more parameter domains.

In examples, the respective first data may comprise a respective discrete distribution of probabilities each attributed to a respective one of the discrete set of curve types. In other words, the NN part outputs a distribution of probabilities over the curve types, such that a probable curve type may be inferred for the sweep curve.

Alternatively or additionally, in examples, the respective second data may comprise (for each curve type) a respective parameter value for each of the respective discrete set of one or more parameter domains. In other words, the NN part directly outputs the parameter values for the inferred curve types. This simplifies the learning and improves convergence and accuracy, in particular when the parameters are continuous and it is difficult to learn a neural network outputting a density distribution.

Architectures of the neural network leading to particularly accurate results are now discussed.

In options, the neural network may comprise an initial encoder taking as input the freehand drawing (which is a 2D image). The encoder may be a convolutional neural network (CNN). The CNN may be a 2D CNN and take as input 2D image data.

Example characteristics of a loss for a supervised training which lead to an accurate result are now discussed.

In examples, the loss may be invariant to sequence cyclic permutation, and/or reference based sketch. In other words, with respect to a candidate solid CAD feature for inference, the loss may be invariant to a cyclic permutation of its curve sequence and/or invariant to replacing the closed 2D planar sketch by its image at the end of the sweep operation and inverting the sweep operation. Such a loss handles the case of a freehand drawing possibly and correctly representing different solid CAD features if the solid CAD features yield a same 3D shape. This improves accuracy of the learning as this focalizes the learning on important parameters, releasing the learning method from having to learn unnecessary information.

The loss may penalize one or more quantities e.g. each via a respective loss term. The penalized quantities may comprise, for a time step respective to each sequence curve and for the step respective to the sweep curve (each freehand drawing being here associated to a respective ground truth solid CAD feature), any one or any combination of the following quantities:

a lowness of the probability of the respective data attributed to the respective curve type of the corresponding ground truth curve, a disparity between the one or more respective parameter values of a ground truth curve and the one or more respective parameter values of its corresponding respective data, and/or (only for RNN cell time steps) a lowness of the probability of the respective probability (outputted by an RNN cell) attributed to the corresponding ground truth end Versus continuing state.

In other words, the supervised training may, by minimizing such a loss, act on the weights of the neural network so as to tend to make the respective probabilities outputted by each RNN cell and the NN part close to 1 (i.e. not low) for the corresponding ground truth curve type and close to 0 (i.e. low) for the other curve types, and/or to make the respective continuous parameter values outputted by each RNN cell and the part close to their ground truth values. Such a loss handles accurately the discrete/continuous mixture of the problem. Also, the loss penalizes a disparity of the inferred curve sequence length with its ground truth value.

An example of an unsupervised training which leads to an accurate result is now discussed, where the respective first data comprise a respective discrete distribution of probabilities each attributed to a respective one of the discrete set of curve types.

As known, an unsupervised training minimizes a loss. The minimizing includes exploring candidate respective discrete distributions of probabilities. In other words, the minimizing iteratively modifies neural network weights to explore outputted respective discrete distributions of probabilities and make them consistent with an unlabeled dataset (where each freehand drawing is not associated to any ground solid CAD feature). In a sense, the exploration of the candidate respective discrete distributions of probabilities is indirect, and a consequence of the direct exploration of the weights. In options, the minimizing further includes exploring candidate respective discrete distributions of probabilities for the end token. In examples, the minimizing further includes exploring candidate respective parameter values for each of the respective discrete set of one or more parameter domains.

Now, the loss penalizes, for each freehand drawing of the dataset and for each candidate, a disparity with a corresponding freehand drawing. The corresponding freehand drawing is derived from a respective solid CAD feature, itself inferable based on the explored candidate respective discrete distribution of probabilities. In other words, given weight values of the neural network (at any iteration of the unsupervised training), the neural network may be inputted with a freehand drawing of the unlabeled dataset to perform inference of solid CAD features. Each inferred solid CAD feature may itself be based upon to derive in a freehand drawing (by playing the tree and determining a freehand drawing of the result). Such a derived freehand drawing may be compared to the initial corresponding dataset's freehand drawing.

In examples, the unsupervised training may comprise a sampling step for at least one (e.g. each) freehand drawing. The training may comprise providing mini-batches and the sampling may comprise, for each mini-batch, sampling a solid CAD feature per freehand drawing of the mini-batch by following the data outputted by the neural network (including the probability distribution(s) and the continuous parameter value(s) outputted by the RNN). The sampling may then calculate the loss, which compares (i.e. penalizes disparity between) the input freehand drawing (or its representation, e.g. rendering) and the freehand drawing corresponding to the sampled solid CAD feature. This loss is not differentiable relative to the sampling since the sampling is stochastic and discrete. Thus, a classical backpropagation of the true gradient relative to the variables cannot be performed, since there is no such true gradient.

The proposed example of unsupervised training proposes to use a reinforcement approach to provide a pseudo-gradient of the loss relative to a variable representing the candidate respective discrete distributions of the respective first data, and optionally a pseudo-gradient of the loss relative to a variable representing the candidate respective discrete distributions over the geometrical operations and/or a pseudo-gradient of the loss relative to a variable representing the end token distribution. The minimizing may then include a backpropagation (e.g. stochastic descent) of such pseudo-gradient(s) of the loss to learn the neural network. Since the pseudo-gradients are provided by a reinforcement approach, the learning is accurate even if the backpropagation is not the one of a true gradient. The minimizing may also include a backpropagation of the (true) gradient of the loss relative to the respective parameter values for each of the respective discrete set of one or more parameter domains (since the loss is differentiable relative to these variables). The reinforcement approach thus solves the differentiability issue raised by the introduction of discrete probability distributions, and only this issue.

An example machine-learning process including the examples of the methods is now discussed.

Recurrent Neural Networks

The example machine-learning process is based on recurrent neural networks (RNN). A recurrent neural network is a deep neural network with an internal memory state. Recurrent neural networks can thus exhibit a temporal behavior, unlike feedforward neural networks. They implicitly take into account the past entries to predict the next outcome. They can be written as $y_t = f_w^1(x_t, h_t)$, $h_{t+1} = f_w^2(x_t, h_t)$, where y is the output, x is the input, and h is the internal hidden state, also called memory w are the weights of the RNN. The memory h is not a hard memory stacking all the past inputs, it is a fixed sized vector, that is learned through $f_w^2$, such that the RNN learns to keep only useful information from the past steps.

Aim of the Example Machine-Learning Process

Given a freehand drawing of a solid, the example machine-learning process aims at obtaining a plausible solid CAD feature representing the freehand drawing. The example machine-learning process focuses on solid CAD features defined, with respect to a 3D space, by (and only by):

a closed 2D planar sketch, composed by a sequence of planar curves resulting in a closed contour, followed by a sweep operation generating a solid by sweeping the closed surfaced defined by the 2D planar sketch in the 3D space, i.e. the solid is defined by the volume that the closed surfaced goes through.

Principle of the Example Machine-Learning Process

The example machine-learning process takes a freehand perspective drawing of a solid as input and produces a solid CAD feature by means of an end-to-end deep learning model.

1. First, a compact latent representation of the drawing is generated by a Convolutional Neural Network (CNN).
2. The solid CAD feature is then inferred from this latent representation in two steps:
   a. Firstly, the closed 2D planar sketch is inferred by a Recurrent Neural Network (RNN). The sketch is defined by a sequence of curves. Each temporal step of the RNN corresponds to a curve of the sequence. At each time step, the respective RNN cell estimates the type of the curve (line, spline, arc), its parameters as well as an end/continue token (whether is the last element of the sequence or not).
   b. Secondly, a Neural Network (NN) predicts the sweep.

The whole model (CNN encoder, RNN, NN) is trained end-to-end in a supervised way, when ground truth solid CAD features are available. Otherwise for an unsupervised training, a rendered image of the inferred geometry is generated and the whole model is optimized so that the rendered image fits the input freehand drawings.

Implementation Option of the Example Machine-Learning Process

The example machine-learning process can be generalized to any type of 2D planar sketch, composed by a sequence of parametric curves, and a parametric sweep operation.

However, the present discussion only consider samples, indexed by i, where the 2D planar sketches are composed by a sequence of parametric curves $(c_x(u), \forall u \in [0, 1]$, with parameters x) of length $T_i$, each curve being indexed by $t \in [1, \ldots, T_i]$, Respectively, the example machine-learning process only considers sweep operations consisting in sweeping the 2D planar sketch along a curve $(c_x(u), \forall u \in [0, 1]$, with parameters x). For both the 2D planar sketches and the sweep operation, the example machine-learning process considers the following curve types:

Line: A straight line segment with parameters $x=(p^{start}, p^{end})$, where $p^{start}$ and $p^{end}$ are the two boundary (i.e. starting and ending) points of the segment:

$$c_x(u) = p^{start} + (p^{end} - p^{start})u, \forall u \in [0,1]$$

Arc: A circular arc segment with parameters $x=(p^{start}, p^{inter}, p^{end})$, passing through $p^{start}$, $p^{inter}$ and $p^{end}$. $p^{start}$ and $p^{end}$ being two boundary points of the segment and $p_{inter}$ is an intermediate point. For the sake of completeness, an Appendix section provides the arc equation from three points.

Cubic Hermite interpolated segment. A segment defined by the cubic Hermite interpolation with parameters $x=(p^{start}, t^{start}, p^{end}, t^{end})$, where $p^{start}$ and $p^{end}$ are the two boundary points of the segment and $t_{start}$ and $t_{end}$ respectively their tangents:

$$c_x(u) = (2u^3 - 3u^2 + 1)p^{start} + (u^3 - 2u^2 + u)t^{start} + (-2u^3 + 3u^2)p^{end} + (u^3 - u^2)t^{end}, \forall u \in [0,1]$$

Different reasons to select these curve types include the following:

The parameters of those curves are meaningful for any user. As a result, the obtained solid CAD features can be easily edited. In particular, the cubic Hermite interpolation is widely used in design (e.g. Catmull-Rom spline).

They can represent a wide variety of shapes. Moreover, if a shape cannot be represented by a sequence of those curves, such a sequence can approach it easily (each curve of the sequence approaching locally a region of the shape).

Such a representation as well allows easily implementation of the most common sweeping operations: extrusion and revolution.

Pipeline Option of the Example Machine-Learning Process

The main steps of the example machine-learning process pipeline are the following:

1. Generate a synthetic labelled data set (if needed)
2. Train the model end-to-end (supervised, with labeled data)

3. Train the model end-to-end (unsupervised, with unlabeled data)
4. Inference

The example machine-learning process contemplates two different ways of training the model. When labeled data is available (or synthetically generated in the step 1), the model may be trained in a supervised way. In examples of such a case, the model may be only in a supervised way and/or step 3 may be skipped. In alternative examples of such a case, the model may be trained in an unsupervised way, after being pre-trained with synthetic data. Alternatively to such a case, the model may be trained in an unsupervised way only.

Description of the Example Machine-Learning Process

1. Generate a Synthetic Labelled Data Set (if Needed)

The example machine-learning process considers a labelled data set as a set of freehand drawings of solids associated to the solid CAD feature from which the actual geometry of the solid can be generated. Such a dataset is rarely available. If missing, it can be synthetically generated with a random generator.

a. Solid CAD Features Generation

First, solid CAD features are sampled from a given distribution. The distribution may be designed by a user taking into account any later application. The example machine-learning process will be specialized in learning to retrieve solid CAD features of this distribution.

The following now describes an example of a generic distribution, dealing with 2D planar sketches composed by sequences of curves of length up to N=10 (N may take any strictly positive integer value) and a sweep operation consisting in sweeping the 2D planar sketch along a curve. Each sampled solid CAD feature is indexed by i.

The 2D planar sketches are sampled as follows:

The length of the sequence $T_i$ is uniformly sampled in ⟦2, N⟧.

Figure 3:
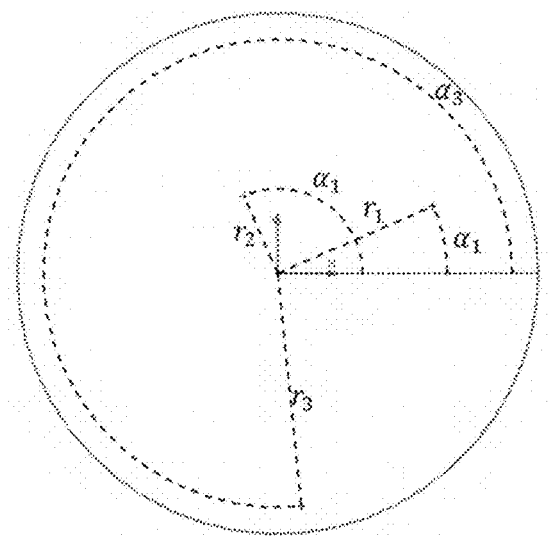

$\forall t \in $ ⟦$1, T_i$⟧ two real values $\alpha_t$ and $r_t$ are uniformly sampled respectively in $[0, 2\pi[$ and $]0, 1]$ and a curve type $c_t^i$ is uniformly chosen among the possible curve types. The values of $\alpha_t$ are then ordered by increasing values ($\alpha_1 \leq \ldots \leq \alpha_{T_i}$). FIG. 3 shows an example of such a random sampling, where $T_i=3$, represented in a unary circle.

For each $t \in $ ⟦$1, T_i$⟧, with the convention $T_i+1=0$ the curve of type $c_t^i$ with parameters $x_t^{c_t^i}$ is instantiated. The parameters are chosen in the following way:

Whatever the curve type $c_t^i$ is the parameters $p^{start}$ and $p^{end}$ are set so that $p^{start}$ (respectively $p^{end}$) is the vector of length $r_t$ (respectively $r_{t+1}$), having an angle with respect to the axis $$h = \begin{pmatrix} 1 \\ 0 \\ 0 \end{pmatrix}$$

of $\alpha_t$ (respectively $\alpha_{t+1}$) radians and lying on the "ground plane" (passing through the origin and normal to $$z = \begin{pmatrix} 0 \\ 0 \\ 1 \end{pmatrix}).$$

In the case of $c_t^i$=Arc, a point $\mu^{inter}$ is uniformly sampled in the segment $\overline{p^{start}p^{end}}$. The additional parameter $p^{inter}$ is sampled from the Gaussian distribution $\mathcal{N}(\mu^{inter}, \Sigma)$, where $\Sigma$ is a diagonal matrix with its nonzero elements equals to $\|p^{end}-p^{start}\|_2$, the z coordinate of $p^{inter}$ is set to 0 so that it lies as well in the "ground plane".

In the case of $c_t^i$=Cubic Hermite interpolated segment, two points $\mu^{start}$ and $\mu^{end}$ are uniformly sampled in the segment $\overline{p^{start}p^{end}}$. The points $p^{start\prime}$ and $p^{end\prime}$ are respectively sampled from the Gaussian distributions $N(\mu^{start}, \Sigma)$ and $N(\mu^{end}, \Sigma)$, where $\Sigma$ is a diagonal matrix with its nonzero elements equals to $\|p^{end}-p^{start}\|_2$. The z coordinate of $p^{start\prime}$ and $p^{end\prime}$ are set to 0 so that both points lie in the "ground plane". Finally $t^{start}$ and $t^{end}$ are set to $t^{start}=p^{start\prime}-p^{start}$ and $t^{end}=p^{end\prime}-p^{end}$.

If the instantiated curve intersects itself or one of the previous instantiated curves the process is repeated until it does not. If after a number of trials, say 10, there are still some intersections the whole sample is regenerated from the beginning.

Figure 4:
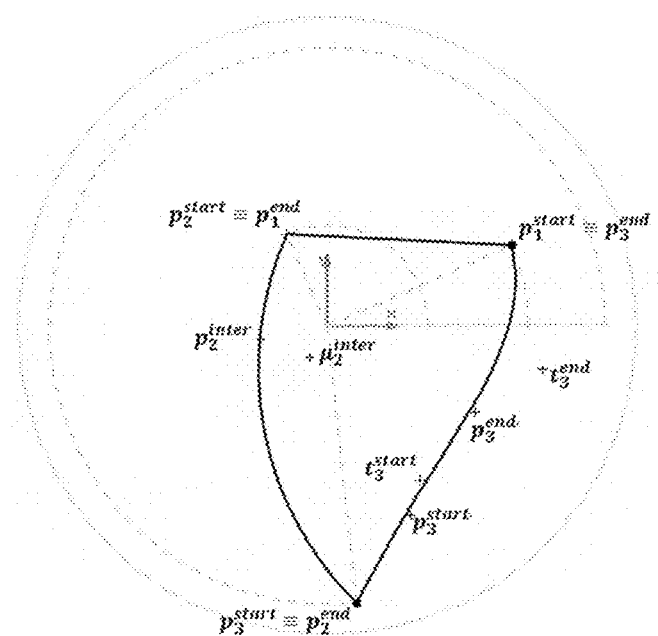

FIG. 4 shows the example of FIG. 3 where $c_1^i$=Line, $c_2^i$=Arc and $c_3^i$=Cubic Hermite interpolated segment.

The sweep operation is sampled as follows:

A curve type s is uniformly chosen among the possible curves types.

The curve of type $s^i$ with parameters $y^{s_i}$ is instantiated. The parameters are chosen in the following way:

Whatever the curve type $s^i$ is the parameter $p^{start}$ is set at the origin. The $p^{end}$ parameter is uniformly sampled in $[-0.5, 0.5] \times [-0.5, 0.5] \times [0.1, 1.0]$.

Depending on the curve type $s^i$, the rest of parameters are sampled in the same way than for the curves of the 2D planar sketches but without forcing them to lie in the "ground plane".

FIG. 5 shows the same example as FIG. 4 where $s^i$=Cubic Hermite interpolated segment.

This generic distribution can be specialized to generate a particular type of solid CAD features. The following provides several restrictions to be applied in order to generate different kinds of solids:

Regular right prisms

The types of curves are restricted to the Line curve type ($\forall t \in $ ⟦$1, T_i$⟧ $c_t^i$=Line and $s^i$=Line).

The length of the sequence $T_i$ is uniformly sampled in ⟦3, N⟧ instead of in ⟦2, N⟧.

The boundary points of the linear segment are distributed regularly in the unary circle ($\forall t \in $ ⟦$1, T_i$⟧ we set $r_t=1$ and $$\alpha_t = \frac{t}{r_i} 2\pi).$$

The sweep line is set to be vertical (The $p^{end}$ parameter of the sweep curve is uniformly sampled in $\{0\} \times \{0\} \times [0.1, 1.0]$).

Cylinders

The 2D planar sketch is composed by arcs forming a unary circle. The types of curves are restricted to the Arc curve type for the 2D planar sketch ($\forall t \in $ ⟦$1, T_i$⟧ $c_t^i$=Arc) and their parameters are chosen such that their control points—defined by the arc parameters—lie in the unary circle).

The types of for the sweep operation curve are restricted to the Line curve type ($s^i$=Line).

The sweep line is set to be vertical (The $p^{end}$ parameter of the sweep curve is uniformly sampled in $\{0\} \times \{0\} \times [0.1, 1.0]$).

A solid CAD feature $SCF_i$ may in the example machine-learning process completely be defined by the different curves types and their parameters: $SCF_i = \{c_1^i, \ldots, c_{T_i}^i, x_1^{c_1^i}, \ldots, x_{T_i}^{c_{T_i}^i}, s^i, y^{s^i}\}$.

In order to make all the solid CAD features have similar size (which makes the learning process easier), they may be resized so that the largest side of their bounding box is equal to 1 and centered (the center of their bounding box being at the origin).

b. Training Sample Generation

Then, for each solid CAD feature, one or more viewpoints are uniformly sampled in a sphere centered at the origin. The sphere radius may be chosen so that the whole solid CAD feature is visible in an image rendered from this position and looking to the origin.

We define an edge as $C^k$ discontinuity of the generated solid. For each sample we randomly chose k=1 (tangent discontinuity, sharp edges) or k=2 (curvature discontinuity, for example the edge between a planar surface and a cylindrical surface).

Then, the contour and the visible edges of the solid CAD feature may be rendered from the sampled viewpoint and looking to the origin in an image $I^i$.

Finally, a training sample i is generated by associating a rendered image $I^i$ to its corresponding solid CAD feature $SCF_i$, which parameters have been previously expressed in the viewpoint coordinates frame.

Figure 8:
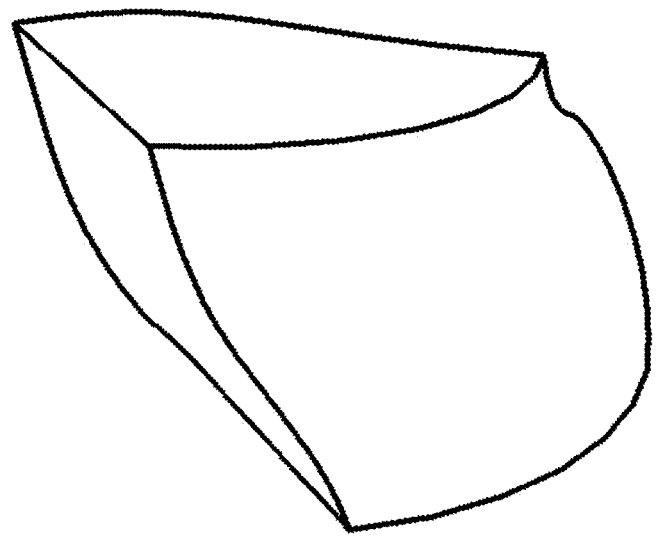

FIG. 6 shows a rendered image of a solid CAD feature using $C^1$ discontinuities as edges. FIG. 7 shows a rendered image the same solid CAD feature using $C^2$ discontinuities as edges. FIG. 8 shows a rendered image of the solid CAD feature represented in FIG. 5. In this case, every $C^2$ discontinuity is a $C^1$ discontinuity as well, i.e. rendering using $C^1$ or $C^2$ discontinuities as edges will provide the same result.

c. Sample Perturbation

Finally, the rendered edges and contours may be disturbed in order to imitate freehand strokes.

The example machine-learning process follows the optional strategy below:

Contours and edges are previously rendered in a vectorial way, such as the svg format (i.e. each rendered segment corresponds to a parametric curve)

Each curve is divided in an arbitrary number of curves (e.g. Bézier curves).

A Gaussian noise is added to each parameter of the curve.

Figure 9:
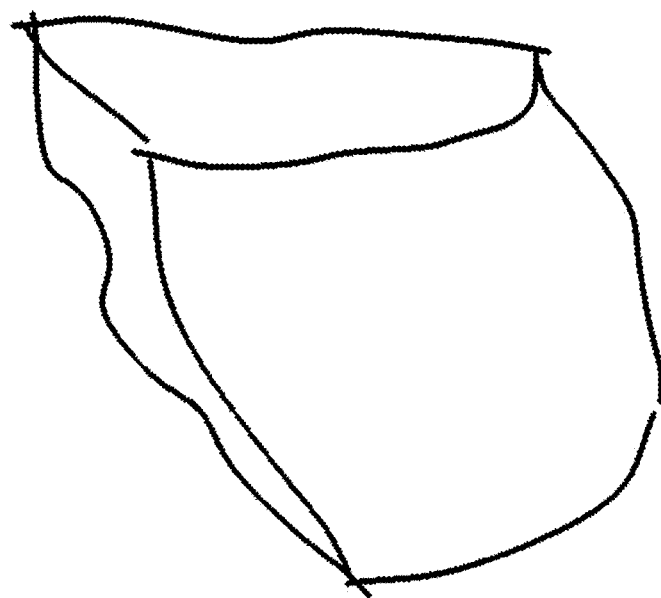
Figure 10:
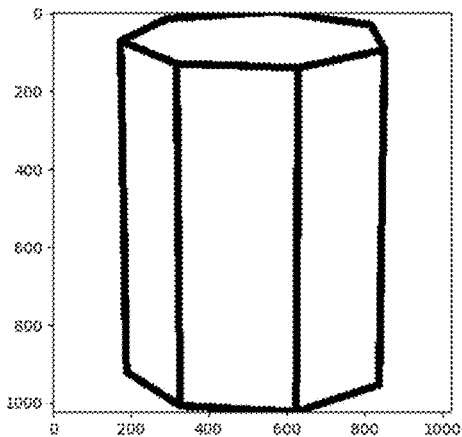
Figure 11:
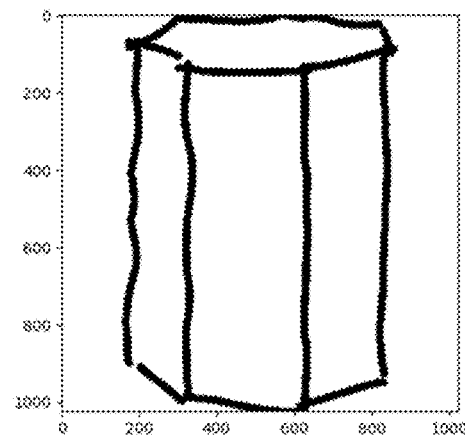

FIG. 9 shows a perturbated image of the rendering shown in FIG. 8. FIG. 10 shows another example of a solid CAD feature rendering (representing a regular right prism). FIG. 11 shows a perturbated image of the rendering of FIG. 10.

2. Train the Model End-to-End (Supervised, with Labeled Data)

In order to train the model, the example machine-learning process considers a dataset of size N. Each sample of the dataset, indexed by i, is composed by a freehand drawing image $\hat{I}^i$, a 2D base sketch curve sequence, a sweep operation $\hat{s}^i$ and its associated parameters $\hat{y}^i$. Let $\hat{T}_i$ be the length of the i-th 2D base sketch curve sequence. Each curve sequence is written as a sequence of curve types $\hat{c}_1^i, \ldots, \hat{c}_{\hat{T}_i}^i$. For each curve $\hat{c}_t^i$, let $\hat{x}_t^i$ be its parameters.

Model Definition

The model takes as input a single channel image representing a freehand drawing (synthetic or not) $\hat{I}^i$. The image is encoded by a CNN as a feature vector $f_w(\hat{I}^i)$, where w are the weights of the model.

An RNN estimates the 2D base sketch. Each RNN cell outputs at each time step t a discrete distribution $p_t$ over the curve possible types, as well as a Bernoulli distribution $q_t$ over the end/continue token indicating whether the sketch is over. Each cell also outputs the predicted continuous parameters $x_t^c$ at each time step t for each curve type c and a state vector $h_t$.

Each RNN cell takes as input the following elements:

The feature vector $f_w(\hat{I}^i)$.

The state vector outputted by the previous cell $h_{t-1}$, with $h_0 = 0$.

Optionally, one or several curve types $c_1^i, \ldots, c_{t-1}^i$ sampled from the estimated distributions $p_1^i, \ldots, p_{t-1}^i$ predicted by the previous RNN cells and/or their estimated parameters $x_1^{c_1^i}, \ldots, x_{t-1}^{c_{t-1}^i}$.

More specifically, each RNN cell equation may be written as it follows:

$$\begin{pmatrix} p \\ q \\ x \end{pmatrix}_t = f_w^1\left(f_w(\hat{I}^i), h_t, c_1^i, \ldots, c_{t-1}^i, x_1^{c_1^i}, \ldots, x_{t-1}^{c_{t-1}^i}\right),$$

$$h_t = f_w^2\left(f_w(\hat{I}^i), h_{t-1}, c_1^i, \ldots, c_{t-1}^i, x_1^{c_1^i}, \ldots, x_{t-1}^{c_{t-1}^i}\right)$$

We recall that the $c_1^i, \ldots, c_{t-1}^i, x_1^{c_1^i}, \ldots, x_{t-1}^{c_{t-1}^i}$ inputs are optional.

Then, a standard NN outputs a discrete distribution r over the possible types of sweep operations as well as the continuous parameters $y^s$ for each sweep operation type s. It takes as input:

The feature vector $f_w(\hat{I}^i)$.

The state vector outputted by the last cell $h_{\hat{T}_i}$.

Optionally, one or several curve types $c_1^i, \ldots, c_{\hat{T}_i}^i$ sampled from the estimated distributions $p_1^i, \ldots, p_{\hat{T}_i}^i$ predicted by the previous RNN cells and/or their estimated parameters $$x_1^{c_1^i}, \ldots, x_{\hat{T}_i}^{c_{\hat{T}_i}^i}.$$

Figure 12:
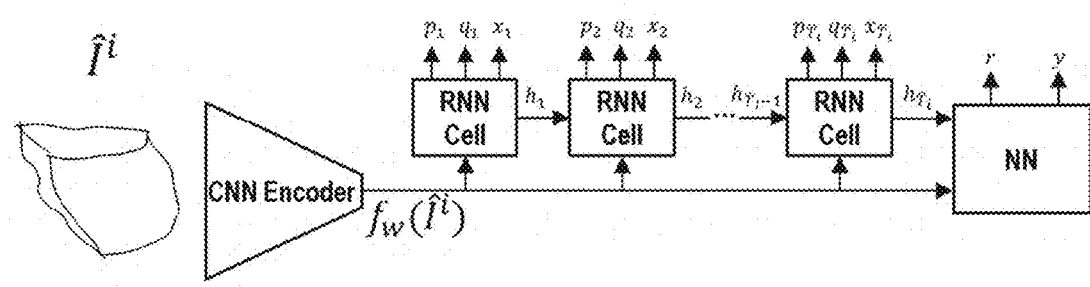

FIG. 12 shows a pipeline of an example of the model presented in the example machine-learning process. The RNN Cells and/or the NN may take different inputs as stated above.

Loss Definition

For the sake of simplicity, we will note from now on the estimated distributions and parameters as functions of the input image $\hat{I}^i$, although they may depend on other variables as explained above.

We define a loss penalizing the curve and sweep operation types prediction error:

$$L_{type}(w) = -\sum_{i=1}^{N}\left[\frac{1}{\hat{T}_i}\sum_{t=1}^{\hat{T}_i}\log\left[p_t^{\hat{c}_t^i}(\hat{I}^i)\right] + \log\left[r^{\hat{s}^i}(\hat{I}^i)\right]\right] \quad \text{(Eq. 1)}$$

Similarly, we define a loss that enforces the curves sequence to have the correct length:

$$L_{length}(w) = -\sum_{i=1}^{N} \frac{1}{\hat{T}_i} \left[ \sum_{t=1}^{\hat{T}_i} \log\left[q_t(\hat{I}^i)\right] + \log\left[1 - q_{\hat{T}_i}(\hat{I}^i)\right] \right] \quad \text{(Eq. 2)}$$

We define as well a loss penalizing the squared error on the predicted curve and sweep operation parameters:

$$L_{parameters}(w) = \sum_{i=1}^{N} \left[ \frac{1}{\hat{T}_i} \sum_{t=1}^{\hat{T}_i} \left\| \hat{x}_t^i - x_t^{\hat{c}_t^i}(\hat{I}^i) \right\|_2^2 + \left\| \hat{y}^i - y^{\hat{s}^i}(\hat{I}^i) \right\|_2^2 \right] \quad \text{(Eq. 3)}$$

Finally, the loss we minimize to train the weights of the network (using standard deep learning techniques, such as ADAM solver over mini-batches) is the following:

$$L_{sup}(w) = L_{type}(w) + L_{length}(w) + \lambda L_{parameters}(w) \quad \text{(Eq. 4)}$$

Where $\lambda$ is a weighting parameter. It can, for example, be initialized as:

$$\lambda = \frac{L_{type}(w_0) + L_{length}(w_0)}{L_{parameters}(w_0)}$$

where $w_0$ are the randomly initialized weights of the neural network.

Any lowness penalization function other than a log (cross-entropy term) may be used for any of the terms $L_{type}(w)$ and $L_{length}(w)$, and/or any distance $d$ other than the L2 distance and/or any increasing and/or positive incr function other than the square function may be used for $L_{parameters}(W)$.

Loss Modification: Make it Invariant to Sequence Cyclic Permutation

Two curve sequences are equivalent (generates the same 2D base sketch) if one is a cyclic permutation of the other, i.e. same sequences but starting at different points. As a result, during training, the model of the example machine-learning process may predict a curve sequence distribution generating an accurate 2D base sketch but resulting in a high loss because the prediction is a cyclic permutation of the ground truth. To avoid this issue, we modify the losses in equations $$L_{type}(w) = -\sum_{i=1}^{N} \left[ \frac{1}{\hat{T}_i} \sum_{t=1}^{\hat{T}_i} \log\left[p_t^{\hat{c}_t^i}(\hat{I}^i)\right] + \log\left[r^{\hat{s}^i}(\hat{I}^i)\right] \right] \quad \text{(Eq. 1)}$$

and $$L_{parameters}(w) = \sum_{i=1}^{N} \left[ \frac{1}{\hat{T}_i} \sum_{t=1}^{\hat{T}_i} \left\| \hat{x}_t^i - x_t^{\hat{c}_t^i}(\hat{I}^i) \right\|_2^2 + \left\| \hat{y}^i - y^{\hat{s}^i}(\hat{I}^i) \right\|_2^2 \right] \quad \text{(Eq. 3)}$$

to be invariant to cyclic permutation:

$$L'_{type}(w) = -\sum_{i=1}^{N} \left[ \min_{o \in [0, \hat{T}_i - 1]} \frac{1}{\hat{T}_i} \sum_{t=1}^{\hat{T}_i} \log\left[p_{t+o \bmod \hat{T}_i}^{\hat{c}_t^i}(\hat{I}^i)\right] + \log\left[r^{\hat{s}^i}(\hat{I}^i)\right] \right] \quad \text{(Eq. 5)}$$

$$L'_{parameters}(w) = \quad \text{(Eq. 6)}$$

$$\sum_{i=1}^{N} \left[ \min_{o \in [0, \hat{T}_i - 1]} \frac{1}{\hat{T}_i} \sum_{t=1}^{\hat{T}_i} \left\| \hat{x}_t^i - x_{t+o \bmod \hat{T}_i}^{\hat{c}_t^i}(\hat{I}^i) \right\|_2^2 + \left\| \hat{y}^i - y^{\hat{s}^i}(\hat{I}^i) \right\|_2^2 \right]$$

Loss Modification: Make it Invariant to the Reference Based Sketch

Equivalently two solid CAD features may result on the same geometry. Indeed, a second 2D planar surface will be formed at the end-bound of the sweep operation. As a result, a solid CAD feature defined by the 2D planar sketch of this second surface and a sweep operation following the original sweep operation but on the other way round will result in the same solid. For a given solid CAD feature defined by $\hat{c}_1^i, \ldots, \hat{c}_{\hat{T}_i}^i, \hat{x}_1^i, \ldots, \hat{x}_{\hat{T}_i}^i, \hat{s}^i, \hat{y}^i$, we note its equivalent solid CAD feature $\hat{c}'_1^i, \ldots, \hat{c}'_{\hat{T}_i}^i, \hat{x}'_1^i, \ldots, \hat{x}'_{\hat{T}_i}^i, \hat{s}'^i, \hat{y}'^i$. We modify the losses defined by equation $L_{parameters'}(w)=i$ $$\sum_{i=1}^{N} \left[ \min_{o \in [0, \hat{T}_i - 1]} \frac{1}{\hat{T}_i} \sum_{t=1}^{\hat{T}_i} \left\| \hat{x}_t^i - x_{t+o \bmod \hat{T}_i}^{\hat{c}_t^i}(\hat{I}^i) \right\|_2^2 + \left\| \hat{y}^i - y^{\hat{s}^i}(\hat{I}^i) \right\|_2^2 \right] \quad \text{(Eq. 6)}$$

to be invariant to features representation of a single solid:

$$L''_{parameters}(w) = \quad \text{(Eq. 7)}$$

$$-\sum_{i=1}^{N} \min\left( \min_{o \in [0, \hat{T}_i - 1]} \frac{1}{\hat{T}_i} \sum_{t=1}^{\hat{T}_i} \left\| \hat{x}_t^i - x_{t+o \bmod \hat{T}_i}^{\hat{c}_t^i}(\hat{I}^i) \right\|_2^2 + \left\| \hat{y}^i - y^{\hat{s}^i}(\hat{I}^i) \right\|_2^2, \right.$$

$$\left. \min_{o \in [0, \hat{T}_i - 1]} \frac{1}{\hat{T}_i} \sum_{t=1}^{\hat{T}_i} \left\| \hat{x}'^i_t - x_{t+o \bmod \hat{T}_i}^{\hat{c}_t^i}(\hat{I}^i) \right\|_2^2 + \left\| \hat{y}'^i - y^{\hat{s}^i}(\hat{I}^i) \right\|_2^2 \right)$$

3. Train the Model End-to-End (Unsupervised, with Unlabeled Data)

The model might be fine-tuned, or trained from scratch (i.e. skipping the step 2) with real data.

The Model Architecture is Almost Unchanged (See Step 2).

At each iteration a solid CAD feature is sampled from the estimated distribution, conditioned by an input drawing $\hat{I}^i$, and instantiated with the parameters predicted by the model. Some of the predicted parameters are modified in order ensure a closed 2D base sketch (i.e. the end point of the curve of the sequence must coincide with the start point of the next curve). In the example machine-learning process, we force $P_t^{start}$ to be equal to $P_{t-1}^{end}$. In the particular case of the start point of the first curve and the end point of the last curve of the sequence, in this case we force $P_{T_i}^{end}$ to be equal to $P_1^{start}$.

We denote $T_i$ the sampled sketch sequence (the smallest $t$ where the end token is sampled from $q_t$) length, $c_1^i, \ldots, c_{T_i}^i$ the sampled curves and $s^i$ the sampled sweep operation.

Visible edges of the obtained geometry are rendered with a fixed arbitrary camera pose in an image $I^i$. The rendering process can be seen as a mapping between a solid CAD feature and its resulting rendered view $I^i$. The differential of this mapping is computed with finite differences.

Instead of using the loss defined in step 2. We define a loss comparing the input drawing to the obtained rendered image. An example of such a loss may be the following:

$$L_{unsup}(w) = \Sigma_{i=1}^N d(I^i, \hat{I}^i) \quad \text{(Eq. 8)}$$

Where d is a similarity measure between $I^i$ and $\hat{I}^i$. For example, we can use the Chamfer Distance of the rendered edges in $I^i$ with respect to the non-background pixels of $\hat{I}^i$ (or the other way round).

Minimizing this loss allows us to optimize the weights of the networks, except for the discrete distributions p, q, r, which are only used for the sampling. the example machine-learning process may backpropagate a gradient of the loss with respect to these distributions. The example machine-learning process may use a reinforcement algorithm to get such gradients for the discrete distributions p, q, r. The reinforcement algorithm is limited to these discrete distributions, and thus the unsupervised learning may get true gradients for the other variables. This limits approximation and thereby effects on accuracy.

The reinforcement algorithm may be the REINFORCE algorithm described in the following paper:
R. J. Williams. Simple statistical gradient-following algorithms for connectionist reinforcement learning. Machine Learning, 229-256, 1992

This provides the following gradient formulas:

$$\frac{\partial L_{unsup}}{\partial p^c} = \frac{L_{unsup} - b}{p^c} 1_{t \leq T_i} 1_{c = c_t^i} \quad \text{(Eq. 9)}$$

$$\frac{\partial L_{unsup}}{\partial q} = -\frac{L_{unsup} - b - \rho}{q} 1_{t = T_i} \quad \text{(Eq. 10)}$$

$$\frac{\partial L_{unsup}}{\partial r^s} = \frac{L_{unsup} - b}{r^s} 1_{s = s_i} \quad \text{(Eq. 11)}$$

Where ρ is an additional sparsity reward to encourage the sketch sequence to have a maximal expressivity for a minimal size, and b is a baseline used to reduce the variance of the estimated gradient, and is computed as the running average of past losses.

4. Inference

Once the model is learned, the inference may be straightforward. The user may establish a new freehand drawing and feed the model with it. The most probable (according to the inferred distribution) solid CAD feature may then be generated. Otherwise, several plausible solutions may be computed by sampling form the inferred distribution. Some of the predicted parameters are modified in order ensure a closed 2D base sketch (i.e. the end point of a curve of the sequence must coincide with the start point of the next curve). In an implementation, the process may force $P_t^{start}$ to be equal to $P_{t-1}^{end}$. In the particular case of the start point of the first curve and the end point of the last curve of the sequence, in this case the process may force $P_{T_i}^{end}$ to be equal to $P_1^{start}$.

The example machine-learning process as discussed may allow to propose several plausible solid CAD features, or geometries produced by a swept 2D sketch (the CAD features may be hidden). The predictions of the example machine-learning process are robust to noise

APPENDIX: ARC EQUATION FROM 3 POINTS

Let $P_{start}$, $P_{inter}$ and $P_{end}$ be three points in the space. We define:

the plane Π passing through the points $p_{start}$, $p_{inter}$ and $p_{end}$, the application $f_\Pi: \mathbb{R}^3 \to \mathbb{R}^2$ transforming a three-dimensional point, belonging to Π, to a two-dimensional point in a local two-dimensional coordinates system of the plane Π, the application $f_\Pi^{-1}: \mathbb{R}^2 \to \mathbb{R}^3$ transforming a two-dimensional point in the local coordinates system of the plane Π to the corresponding three-dimensional point, $$\begin{pmatrix} h_{start} \\ v_{start} \end{pmatrix} = f_\Pi(p_{start}),$$

$$\begin{pmatrix} h_{inter} \\ v_{inter} \end{pmatrix} = f_\Pi(p_{inter}) \text{ and}$$

$$\begin{pmatrix} h_{end} \\ v_{end} \end{pmatrix} = f_\Pi(p_{end}).$$

The Arc segment passing through $p_{start}$, $p_{inter}$ and $p_{end}$ is then defined by:

$$c_x(u) = f_\Pi^{-1}\left(O + r\begin{pmatrix} \cos \alpha + (\beta - \alpha)u \\ \sin \alpha + (\beta - \alpha)u \end{pmatrix}\right), \forall u \in [0, 1]$$

Where, $$O = \begin{pmatrix} -\frac{B}{2A} \\ -\frac{C}{2A} \end{pmatrix} \text{ and } r = \sqrt{\frac{B^2 + C^2 - 4AD}{4A^2}}$$

$$A = \begin{vmatrix} h_{start} & v_{start} & 1 \\ h_{inter} & v_{inter} & 1 \\ h_{end} & v_{end} & 1 \end{vmatrix}, B = \begin{vmatrix} h_{start}^2 + v_{start}^2 & v_{start} & 1 \\ h_{inter}^2 + v_{inter}^2 & v_{inter} & 1 \\ h_{end}^2 + v_{end}^2 & v_{end} & 1 \end{vmatrix}$$

$$C = \begin{vmatrix} h_{start}^2 + v_{start}^2 & h_{start} & 1 \\ h_{inter}^2 + v_{inter}^2 & h_{inter} & 1 \\ h_{end}^2 + v_{end}^2 & h_{end} & 1 \end{vmatrix}, D = \begin{vmatrix} h_{start}^2 + v_{start}^2 & h_{start} & v_{start} \\ h_{inter}^2 + v_{inter}^2 & h_{inter} & v_{inter} \\ h_{end}^2 + v_{end}^2 & h_{end} & v_{end} \end{vmatrix}$$

Finally, we note $\theta_{start}$, $\theta_{inter}$ and $\theta_{end}$ respectively the angles of the vector $$\begin{pmatrix} h_{start} \\ v_{star} \end{pmatrix} - O, \begin{pmatrix} h_{inter} \\ v_{inter} \end{pmatrix} - O \text{ and } \begin{pmatrix} h_{end} \\ v_{end} \end{pmatrix} - O$$

with respect to the axis $$h = \begin{pmatrix} 1 \\ 0 \end{pmatrix}:$$

If $\theta_{start} < \theta_{inter} < \theta_{end}$ then $\alpha = \theta_{start}$ and $\beta = \theta_{end}$ If $\theta_{start} < \theta_{end} < \theta_{inter}$ or $\theta_{inter} < \theta_{start} < \theta_{end}$ then $\alpha = \theta_{end}$ and $\beta = \theta_{start} + 2\pi$ If $\theta_{inter} < \theta_{end} < \theta_{start}$ or $\theta_{end} < \theta_{start} < \theta_{inter}$ then $\alpha = \theta_{start}$ and $\beta = \theta_{end} + 2\pi$ If $\theta_{end} < \theta_{inter} < \theta_{start}$ then $\alpha = \theta_{end}$ and $\beta = \theta_{start}$

The invention claimed is:

1. A computer-implemented method for forming a dataset configured for learning a neural network, the neural network being configured for inference, from a freehand drawing representing a 3D shape, of a solid CAD feature representing the 3D shape, the solid CAD feature including a respective sequence of curves and a sweep operation, the method comprising:

generating one or more solid CAD feature includes each representing a respective 3D shape; and for each solid CAD feature:

determining one or more respective freehand drawings each representing the respective 3D shape, and inserting in the dataset, one or more training samples each including the solid CAD feature and a respective freehand drawing, each respective freehand drawing being labeled in the dataset by the solid CAD feature as a ground truth, wherein the determining of each respective freehand drawing further includes:

obtaining a viewpoint from which the respective 3D shape is visible, and rendering in a respective image, relative to a solid representation of the respective 3D shape based on the solid CAD feature, one or more edges, each edge being a contour edge or a visible edge of the solid representation from the viewpoint, the respective image forming the respective freehand drawing and being thereby inserted in the dataset associated with the respective 3D shape to form a respective training sample.

2. The method of claim 1, wherein each visible edge is a $C^k$ discontinuity of the solid representation, k being an integer higher than or equal to 1.

3. The method of claim 1, wherein the determining of each freehand drawing further includes perturbating at least part of the one or more rendered edges.

4. The method of claim 3, wherein the rendering of each edge is performed in a vectorial way, each edge being represented by one or more respective parametric curves, the perturbating includes, for at least one respective parametric curve, adding a noise to one or more parameters of the at least one respective parametric curve.

5. The method of claim 1, wherein the generating includes obtaining a set of curves and sampling the set of curves.

6. The method of claim 5, wherein the set of curves comprises a set product between:

a discrete set of curve types, and for each curve type, a respective discrete set of one or more parameter domains each of a respective parameter, each parameter domain having respective parameter values of the respective parameter, the sampling including obtaining samples each including a respective curve type and a respective parameter value for each of the respective discrete set of one or more parameter domains.

7. The method of claim 6, wherein the discrete set of curve types includes:

a line type, an arc type, and/or a cubic Hermite interpolated segment type.

8. The method of claim 1, wherein each solid CAD feature includes a sweep operation, the generating including obtaining a set of sweep operations and sampling the set of sweep operations.

9. The method of claim 8, wherein the set of sweep operations includes a set product between:

a discrete set of sweep curve types, and for each sweep curve type, a respective discrete set of one or more parameter domains each of a respective parameter, each parameter domain having respective parameters values of the respective parameter, the sampling including obtaining samples each including a respective sweep curve type and a respective parameter value for each of the respective discrete set of one or more parameter domains.

10. A computer-implemented method of applying a data structure representing a dataset formable according to a computer-implemented process for forming a dataset configured for learning a neural network, the neural network being configured for inference, from a freehand drawing representing a 3D shape, of a solid CAD feature representing the 3D shape, the solid CAD feature including a respective sequence of curves and a sweep operation, the process for forming the dataset including:

generating one or more solid CAD feature includes each representing a respective 3D shape; and for each solid CAD feature:

determining one or more respective freehand drawings each representing the respective 3D shape, inserting in the dataset, one or more training samples each including the solid CAD feature and a respective freehand drawing, each respective freehand drawing being labeled in the dataset by the solid CAD feature as a ground truth, wherein the determining of each respective freehand drawing further includes:

obtaining a viewpoint from which the respective 3D shape is visible, and rendering in a respective image, relative to a solid representation of the respective 3D shape based on the solid CAD feature, one or more edges, each edge being a contour edge or a visible edge of the solid representation from the viewpoint, the respective image foul ing the respective freehand drawing and being thereby inserted in the dataset associated with the respective 3D shape to form a respective training sample, the method of applying the data structure comprising: learning the neural network based on the dataset.

11. A device comprising:

a non-transitory data storage medium having recorded thereon a data structure representing a dataset formable according to a computer program for forming a dataset configured for learning a neural network, the neural network being configured for inference, from a freehand drawing representing a 3D shape, of a solid CAD feature representing the 3D shape, the solid CAD feature including a respective sequence of curves and a sweep operation, and the computer program comprising instructions for forming the dataset configured for learning the neural network, the neural network being configured for inference, from the freehand drawing representing the 3D shape, of the solid CAD feature representing the 3D shape, wherein the computer program when executed by a processor causes the processor to be configured to generate one or more solid CAD feature includes each representing a respective 3D shape, for each solid CAD feature:

determine one or more respective freehand drawings each representing the respective 3D shape, and insert in the dataset, one or more training samples each including the solid CAD feature and a respective freehand drawing, each respective freehand drawing being labeled in the dataset by the solid CAD feature as a ground truth, and wherein the processor is further configured to determine each respective freehand drawing by being further configured to:
- obtain a viewpoint from which the respective 3D shape is visible, and
- render in a respective image, relative to a solid representation of the respective 3D shape based on the solid CAD feature, one or more edges, each edge being a contour edge or a visible edge of the solid representation from the viewpoint, the respective image forming the respective freehand drawing and being thereby inserted in the dataset associated with the respective 3D shape to form a respective training sample.

12. The device of claim 11, wherein each visible edge is a $C^k$ discontinuity of the solid representation, k being an integer higher than or equal to 1.

13. The device of claim 11, wherein the processor is further configured to determine of each freehand drawing by being further configured to perturbate at least part of the one or more rendered edges.

14. The device of claim 13, wherein the processor is further configured to render each edge in a vectorial way, each edge being represented by one or more respective parametric curves, the processor is further configured to perturbate by being configured to, for at least one respective parametric curve, add a noise to one or more parameters of the at least one respective parametric curve.

15. The device of claim 11, wherein the processor is further configured to generate by being configured to obtain a set of curves and sampling the set of curves.

16. The device of claim 15, wherein the set of curves includes a set product between:
- a discrete set of curve types, and
- for each curve type, a respective discrete set of one or more parameter domains each of a respective parameter, each parameter domain having respective parameter values of the respective parameter,
- the sampling including providing samples each including a respective curve type and a respective parameter value for each of the respective discrete set of one or more parameter domains.

17. The device of claim 16, wherein the discrete set of curve types includes:
- a line type,
- an arc type, and/or
- a cubic Hermite interpolated segment type.

18. The device of claim 11, wherein the computer program when executed by the processor causes the processor to be configured to
- generate one or more solid CAD feature includes each representing a respective 3D shape,
- for each solid CAD feature:
  - determine one or more respective freehand drawings each representing the respective 3D shape, and
  - insert in the dataset, one or more training samples each including the solid CAD feature and a respective freehand drawing, and
- learn the neural network based on the dataset.

19. The device of claim 11, wherein the computer program when executed by the processor causes the processor to be configured to learn the neural network based on the dataset.

20. The device of claim 11, further comprising the processor communicatively coupled to the non-transitory data storage medium.

* * * * *